US008531250B1

(12) United States Patent
Luschas

(10) Patent No.: US 8,531,250 B1
(45) Date of Patent: Sep. 10, 2013

(54) CONFIGURING A TUNABLE INDUCTOR ACROSS MULTIPLE LAYERS OF AN INTEGRATED CIRCUIT

(75) Inventor: Manuel Luschas, Sunnyvale, CA (US)

(73) Assignee: NetLogic Microsystems, Inc., Irvine, CA (US)

( * ) Notice: Subject to any disclaimer, the term of this patent is extended or adjusted under 35 U.S.C. 154(b) by 168 days.

(21) Appl. No.: 13/069,330

(22) Filed: Mar. 22, 2011

(51) Int. Cl.
*H03B 1/00* (2006.01)

(52) U.S. Cl.
USPC ...... 331/167; 331/36 L; 331/177 V; 336/200; 257/531

(58) Field of Classification Search
CPC .......................................................... H03B 1/00
USPC ............... 331/167, 36 L; 336/200; 257/531
See application file for complete search history.

(56) References Cited

U.S. PATENT DOCUMENTS

| | | | | |
|---|---|---|---|---|
| 6,476,704 | B2 * | 11/2002 | Goff .............................. | 336/200 |
| 6,853,257 | B2 | 2/2005 | Yonekawa et al. | |
| 6,992,532 | B2 | 1/2006 | Christensen | |
| 7,088,214 | B2 * | 8/2006 | Castaneda et al. ............ | 336/200 |
| 7,202,754 | B2 | 4/2007 | Komurasaki et al. | |
| 7,253,497 | B2 * | 8/2007 | Bhatt et al. ..................... | 257/531 |
| 2002/0044025 | A1 | 4/2002 | Park | |

OTHER PUBLICATIONS

U.S. Appl. No. 13/069,316, filed Mar. 22, 2011, Circuits, Systems, and Methods for Configuring a Tunable Inductor Incorporating Dual Coupling of Port Terminals, Manuel Luschas.
U.S. Appl. No. 13/069,323, filed Mar. 22, 2011, Circuits, Systems, and Methods for Configuring a Tunable Inductor Incorporating Dual Coupling of Inductances, Manuel Luschas.
Office Action mailed Jul. 3, 2012, in U.S. Appl. No. 13/069,316, Luschas, filed Mar. 22, 2011.
Office Action mailed Dec. 20, 2012, in U.S. Appl. No. 13/069,316, Luschas, filed Mar. 22, 2011.
Office Action mailed Jul. 5, 2012, in U.S. Appl. No. 13/069,323, Luschas, filed Mar. 22, 2011.
Office Action mailed Dec. 26, 2012, in U.S. Appl. No. 13/069,323, Luschas, filed Mar. 22, 2011.

* cited by examiner

*Primary Examiner* — Arnold Kinkead
(74) *Attorney, Agent, or Firm* — Sterne, Kessler, Goldstein & Fox PLLC

(57) ABSTRACT

A system and method for configuring a tunable inductor that minimizes Q factor are provided. The system and method comprise coupling a first inductance, a second inductance, a third inductance, a switch, and two port terminals. The first inductance and the third inductance are coupled between the switch and the port terminals. The second inductance is coupled between the port terminals or between the first and third inductance. The inductances are each disposed on at least one layer, wherein the first inductance is disposed beneath the second inductance and the third inductance is disposed on the same layer as the second inductance. The components are arranged such that toggling the switch tunes the inductance without adversely affecting the Q factor.

22 Claims, 24 Drawing Sheets

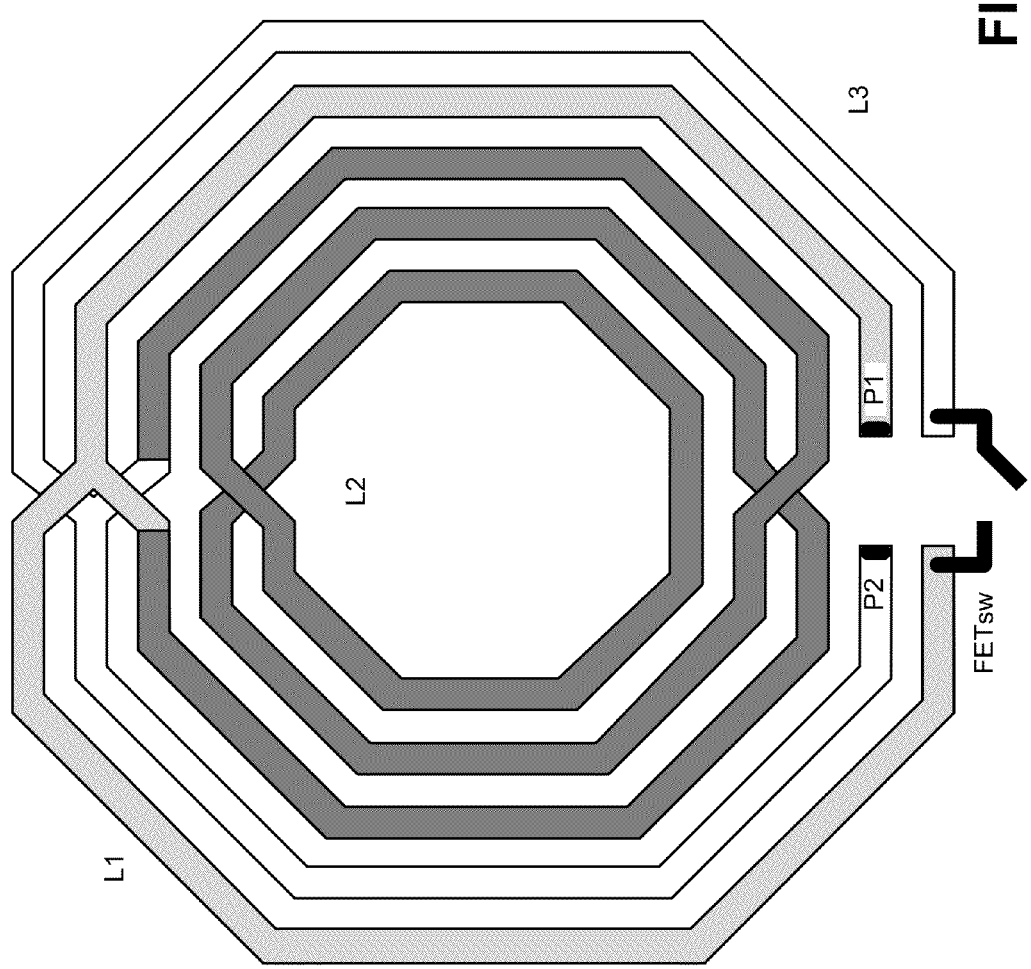

US 8,531,250 B1

CONFIGURING A TUNABLE INDUCTOR ACROSS MULTIPLE LAYERS OF AN INTEGRATED CIRCUIT

FIELD OF THE INVENTION

The present invention relates to methods, circuits, and systems for a tunable inductor. More particularly, the invention relates to a technique for increasing the tuning range of an inductor coil through switching of inductors.

BACKGROUND

Inductors, components that store energy in a magnetic field created by electrical current, are used extensively in signal processing applications. Inductors are typically formed with conducting wire looped a predetermined number of iterations. The inductance value of each turn of a coil, and thus the total inductance value of an inductor, depends on the coil diameter, the number of turns, and other factors.

An inductor is often coupled with a capacitor, a related component that stores energy in an electric field created by a potential difference between a pair of conductors, to form an inductor-capacitor tank ("LC tank") circuit. An LC tank circuit is configured to operate at a known resonant frequency, allowing a communications device incorporating such a circuit to generate a signal at that specific frequency or filter out a signal corresponding to that frequency. The performance of an LC tank circuit is measured by its Q factor, a dimensionless parameter that represents the tendency of a circuit to lose energy. A circuit with a higher Q factor has a lower rate of energy loss and is thus able to maintain higher signal selectivity.

It is often desirable for inductors to be tunable for use in circuits that must be operable at a range of frequencies. One type of tunable inductor may be configured by coupling multiple sets of coils and by switching between them using, in one example, field effect transistor (FET) switches. However, this adds considerable bulk to a circuit incorporating such an inductor. Furthermore, each additional component carries an inductance and capacitance value even when unused, and the numerous additional coils and their accompanying switches would increase the mutual inductance and parasitic capacitance—and thereby degrade the Q factor of the circuit—to intolerable levels.

Hence, it is desirable to have a technique for configuring a tunable inductor that does not add significantly more bulk, capacitance, or mutual inductance to the circuit incorporating it. As will be demonstrated, the present invention provides such a technique in an elegant manner.

BRIEF DESCRIPTION OF THE DRAWINGS

FIG. 9 depicts a geometric diagram of a tunable inductor configured according to an embodiment of the invention.

DETAILED DESCRIPTION

Figure 1:
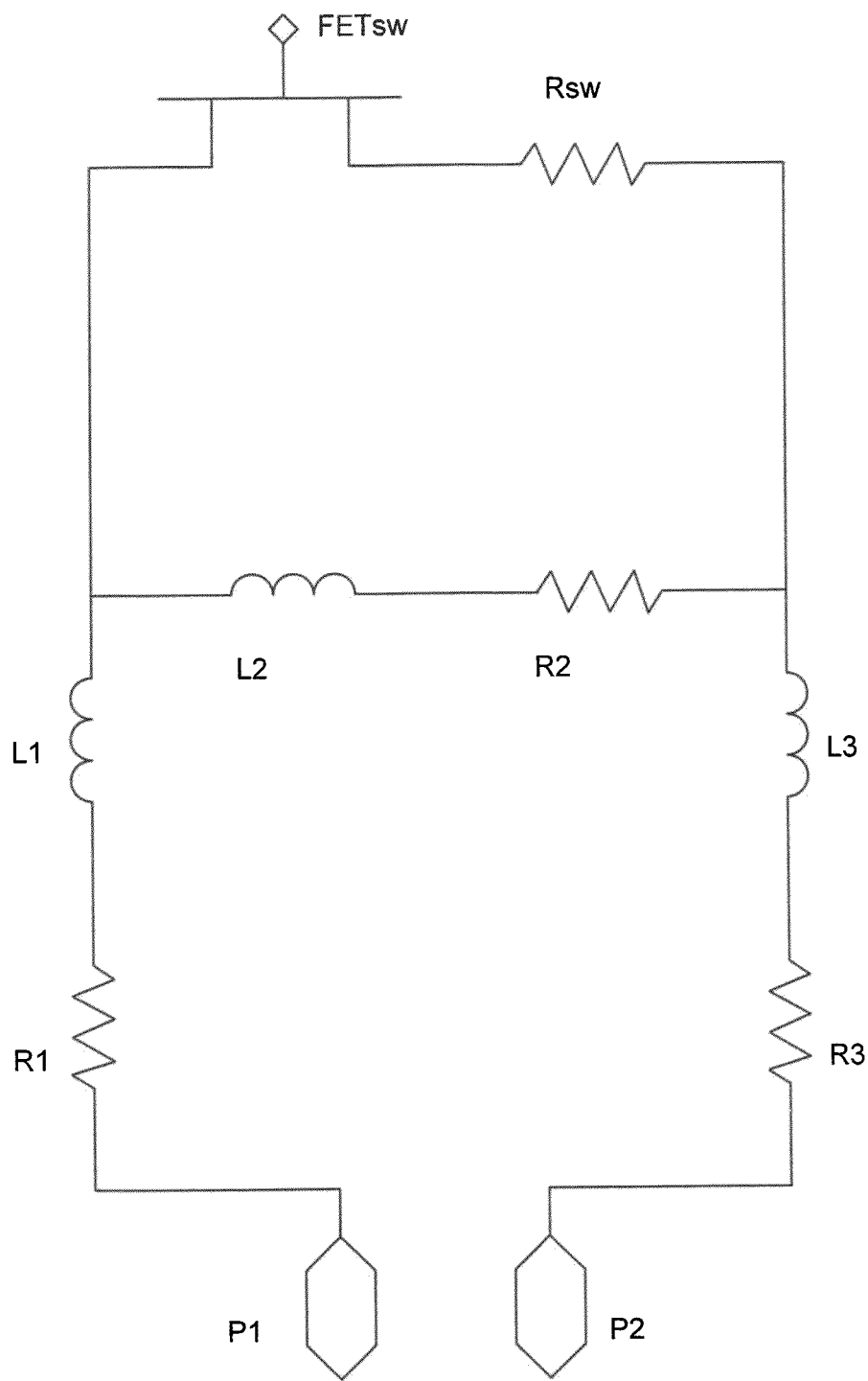
FIG. 1 depicts a circuit diagram of a prior art tunable inductor.

The present invention addresses shortcomings of prior art techniques for configuring tunable inductors.

An LC tank is the most important component in an oscillator circuit, a circuit that generates a rapidly alternating electronic signal (a "clock" signal). The circuit's resonant frequency corresponds to the sinusoidal waveform generated by the oscillator's clock signal. A voltage-controlled oscillator (VCO) is an oscillation circuit whose output frequency varies according to external input voltage. VCO's are typically used in communications-related applications that require the ability to operate at multiple frequencies. A standard inductor-capacitor-based VCO (LC-VCO) includes, as its name implies, an inductor with a fixed inductance value and one or more voltage variable capacitors ("varactors") configured in parallel. A varactor provides a capacitance that is inversely proportional to an applied control voltage. Output frequency is, in turn, inversely proportional to the square root of capacitance. The output frequency of a standard LC-VCO depends upon the capacitive value of the circuit (i.e., the collective capacitance of the capacitors within the circuit); the greater the capacitance, the lower the output frequency. Thus, the output frequency of an LC-VCO can be tuned by adjusting the input voltage applied to the varactors. In communications systems, a VCO is used to tune a frequency in accordance with a particular standard or application.

An LC-VCO has a known, fixed tuning range. For example, a particular LC-VCO can achieve a tuning range of 9-11 GHz. A communications device incorporating such an LC-VCO can only be operated at a limited subset of standardized data rates. A device incorporating an LC-VCO with a wider tuning range of, for example, 8-12.5 GHz, operates at a much greater range of standardized data rates, including 8 Gbps fiber channel and 10 gigabit ethernet. This enhances the versatility and range of potential applications for the LC-VCO. Hence, it is desirable to have a technique for extending the tuning range of an LC-VCO.

Extending the tuning range of an LC-VCO may theoretically be accomplished by increasing the number of varactors in the circuit. However, because varactors have a low Q factor and thus a greater tendency to dissipate power, adding varactors significantly degrades the Q factor of the circuit. Consequently, an LC-VCO can only accommodate a limited number of varactors without a significant reduction of Q factor. Thus, tuning the capacitance of the circuit beyond the range allowed by a single varactor requires adding fixed-value capacitors and switching between them using switches. This would theoretically allow an LC-VCO to achieve lower frequencies.

However, there are a number of problems with such an approach. One problem is analogous to that of coupling multiple inductor coils as described above. To tune the capacitance of a circuit by toggling individual capacitors, a switch must accompany each capacitor or group of capacitors. Because a switch has a non-zero resistance value, increasing the number of switches to accommodate additional capacitors results in a higher equivalent series resistance (ESR) value, and thus a lower Q factor for the circuit. Degradation of the Q factor results in an increase of phase noise (i.e., rapid, random fluctuations in frequency caused by waveform phase distortions) to an extent that would render the oscillator useless. Additionally, because each capacitor carries a discrete, fixed capacitance value, activating additional capacitors only allows for adjustments to the total capacitance in increments corresponding to a capacitor's fixed capacitance value. This requires a higher number of capacitors with a smaller fixed capacitance to facilitate fine-tuning of the circuit's resonant frequency, exacerbating the problems related to degradation of the circuit's Q factor due to parasitic capacitance and equivalent series resistance described above.

For these reasons, a technique for tuning the output frequency of an LC tank that relies on tuning the inductance rather than the capacitance would be advantageous. As with capacitance, the resonant frequency of a circuit is inversely proportional to the square root of inductance, and a tunable inductor may thus be used in many of the same applications as a tunable capacitor without requiring radical changes in applied voltage, current, or other inputs. A tunable inductor without the drawbacks of increased bulk or parasitic capacitance may be particularly useful for an oscillation circuit such as a voltage-controlled oscillator.

Figure 2:
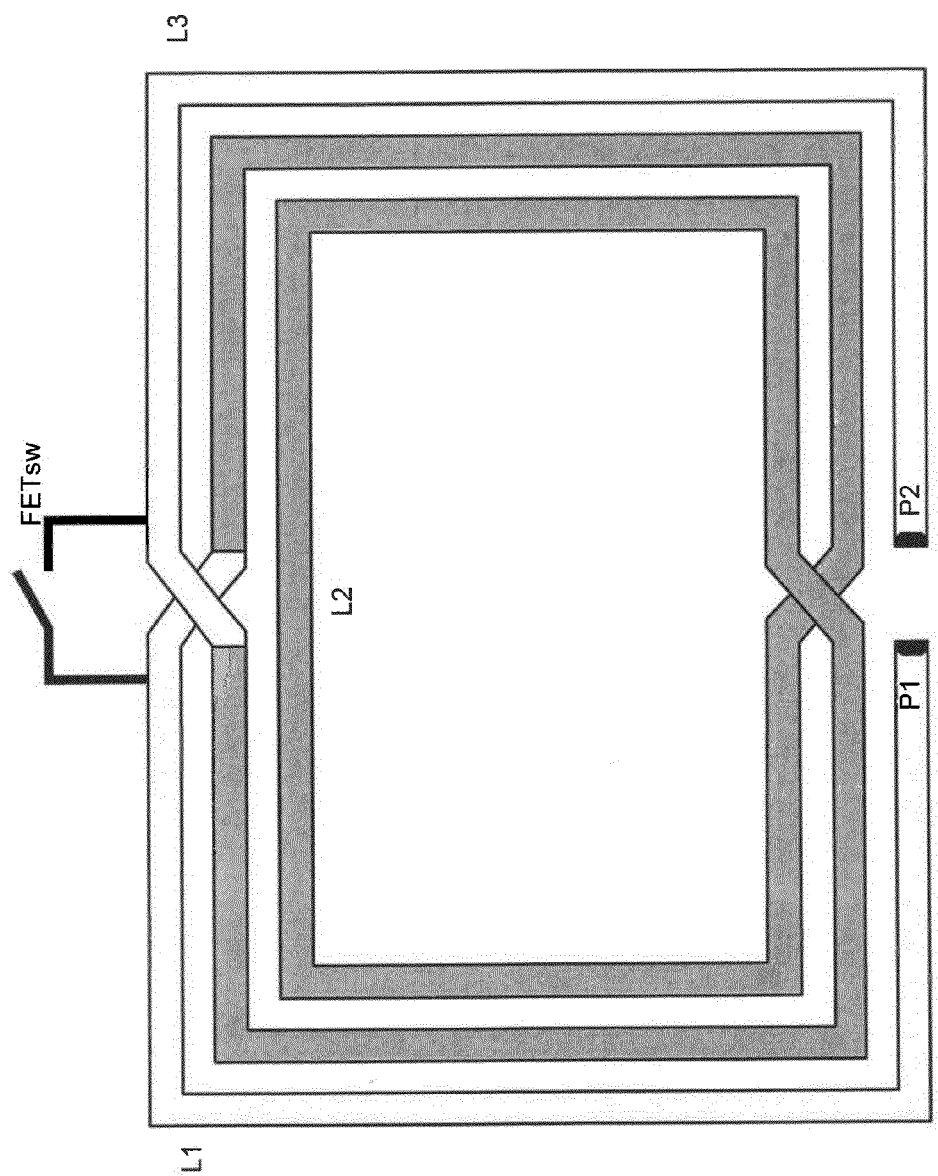
FIG. 2 depicts a geometric diagram of a prior art tunable inductor.

Although techniques and systems for tunable inductors exist in the prior art, these are flawed in several important respects. A prior art tunable inductor coil is illustrated in FIGS. 1 and 2. FIGS. 1 and 2 depict a circuit diagram and a geometric diagram, respectively, of a tunable inductor coil with inductors L1, L2, and L3, each having unique inductance values $L_1$, $L_2$, and $L_3$ and resistance values $R_1$, $R_2$, and $R_3$. As illustrated in the geometric diagram of FIG. 2, inductors L1 and L3 comprise the outer turn of the inductor coil and cross each other such that each comprises one half of a complete turn. L2 comprises the inner turns of the inductor coil and is directly coupled to L1 and L3. L1 and L3 are each simultaneously coupled to L2 and to a switch $FET_{sw}$. In this implementation, the switch is a field effect transistor switch. However, other switches may be used. When $FET_{sw}$ is open (i.e., off), L1, L2, and L3 are connected in series. When closed (i.e., on), $FET_{sw}$ couples L1 and L3 such that L1 and L3 are connected in series. In the circuit diagram of FIG. 1, the L1, L2, and L3 windings are represented by the inductor symbols labeled L1, L2, and L3, respectively. The resistances R1, R2, and R3, coupled in series with inductors L1, L2, and L3, respectively, represent the resistive components of the L1, L2, and L3 windings of FIG. 2. Thus, the total inductance of the circuit with $FET_{sw}$ open, ignoring mutual inductances, is represented by:

$$L_{off} = L_1 + L_2 + L_3$$

The resultant Q factor of the circuit with $FET_{sw}$ open is represented by:

$$Q_{off} = \frac{\omega(L_1 + L_2 + L_3)}{R_1 + R_2 + R_3}$$

The total inductance of the circuit with $FET_{sw}$ closed, ignoring mutual inductances, is represented by:

$$L_{on} = L_1 + L_3$$

The resultant Q factor of the circuit with $FET_{sw}$ closed is represented by:

$$Q_{on} = \frac{\omega(L_1 + L_3)}{R_1 + R_{sw} + R_3},$$

wherein $R_{sw}$ is the resistance of $FET_{sw}$. Assuming inductance values of $L_1$=1 nH, $L_2$=2 nH, $L_3$=1 nH and resistance values of $R_1$=1Ω, $R_2$=2Ω, $R_3$=1Ω, and $R_{sw}$=3Ω (values that approximate a real-world scenario), $L_{off}$ of the above-described inductor coil is greater than $L_{on}$ while $Q_{off}$ is greater than $Q_{on}$. This is an undesirable result, since a lower Q factor results in higher phase noise. Because frequency is inversely proportional to the square root of inductance, it is critical to reduce phase noise at lower inductance values by ensuring a higher Q factor. For example, for embodiments in which a tunable inductor is configured in an oscillator, the ability of the oscillator to maintain a resonant frequency directly correlates with both phase noise and frequency. Although phase noise should always be minimized, higher frequencies have a lower tolerance for phase noise; shorter wavelengths are more sensitive to the subtle waveform fluctuations and distortions caused by phase noise. Thus, a tunable inductor must have a higher Q factor when the inductance is decreased and, consequently, the circuit's resonant frequency is increased.

Furthermore, the parasitic capacitance of the added components adds to the parasitic capacitance of the inductor coil. As noted above, these components carry a capacitance even when unused. In the above implementation, the inductor coil has a higher total inductance, and thus a lower frequency, when $FET_{sw}$ is open. The location of $FET_{sw}$ near the point at which L1 and L3 are coupled to L2 increases the impact of the parasitic capacitance of $FET_{sw}$ when $FET_{sw}$ is open and thus unused. Because Q factor is also inversely proportional to capacitance, $FET_{sw}$ degrades the Q factor of the circuit to an unacceptable degree when open. Consequently, the prior art inductor coil of FIGS. 1 and 2 does not meet the objective of achieving a wider tuning range.

Figure 3:
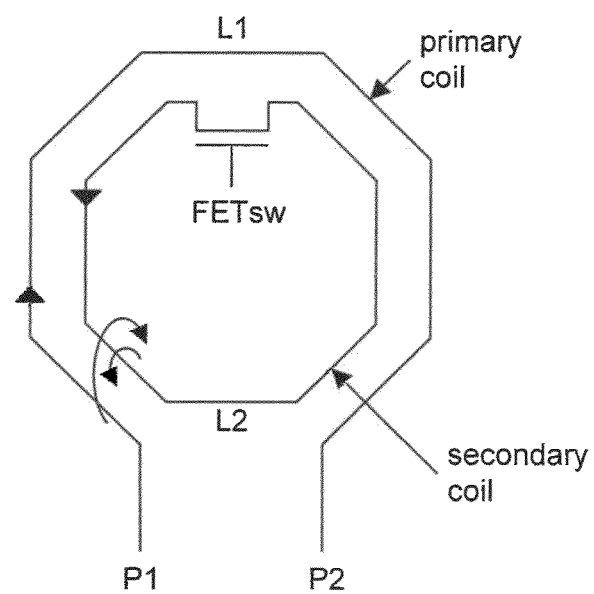
FIG. 3 depicts a geometric diagram of a prior art tunable inductor.

An alternative approach relies on inductive coupling of a passive loop containing $FET_{sw}$, as depicted in FIG. 3. In this implementation, there is a primary inductor L1 and a secondary inductor L2. The primary inductor L1 is coupled in series to two port terminals P1 and P2. The secondary coil L2 is configured within the primary coil L1 and is coupled in series to a switch. In one implementation, the switch comprises a field effect transistor switch. However, other switches may also be used. L2 is isolated by L1 and is not directly connected to terminals P1 and P2 or otherwise coupled to L1. This approach works by relying on the mutual inductance between the inner loop and the outer loop which, when FETsw is on, tunes the inductance on the outer loop. This minimizes resistance added by multiple inductors (the denominator in the above equations) and could thus theoretically result in a higher Q factor. However, this implementation does not result in an optimal inductance, as $Q_{off}$ may still be greater than $Q_{on}$ while $L_{off}$ is greater than $L_{on}$.

Thus, an alternative solution is required. Although using a switch to toggle the connectivity of various inductors within an inductor coil is an effective technique for tuning the inductance—and hence, the resonant frequency—of a circuit incorporating such an inductor coil, an approach that minimizes or counteracts the undesirable effects of the additional components is required. In the example prior art inductor coil illustrated in FIGS. 1 and 2, closing the switch lowers the inductance of the inductor coil, and thus increases the resonant frequency of the circuit incorporating the inductor coil.

Figure 4:
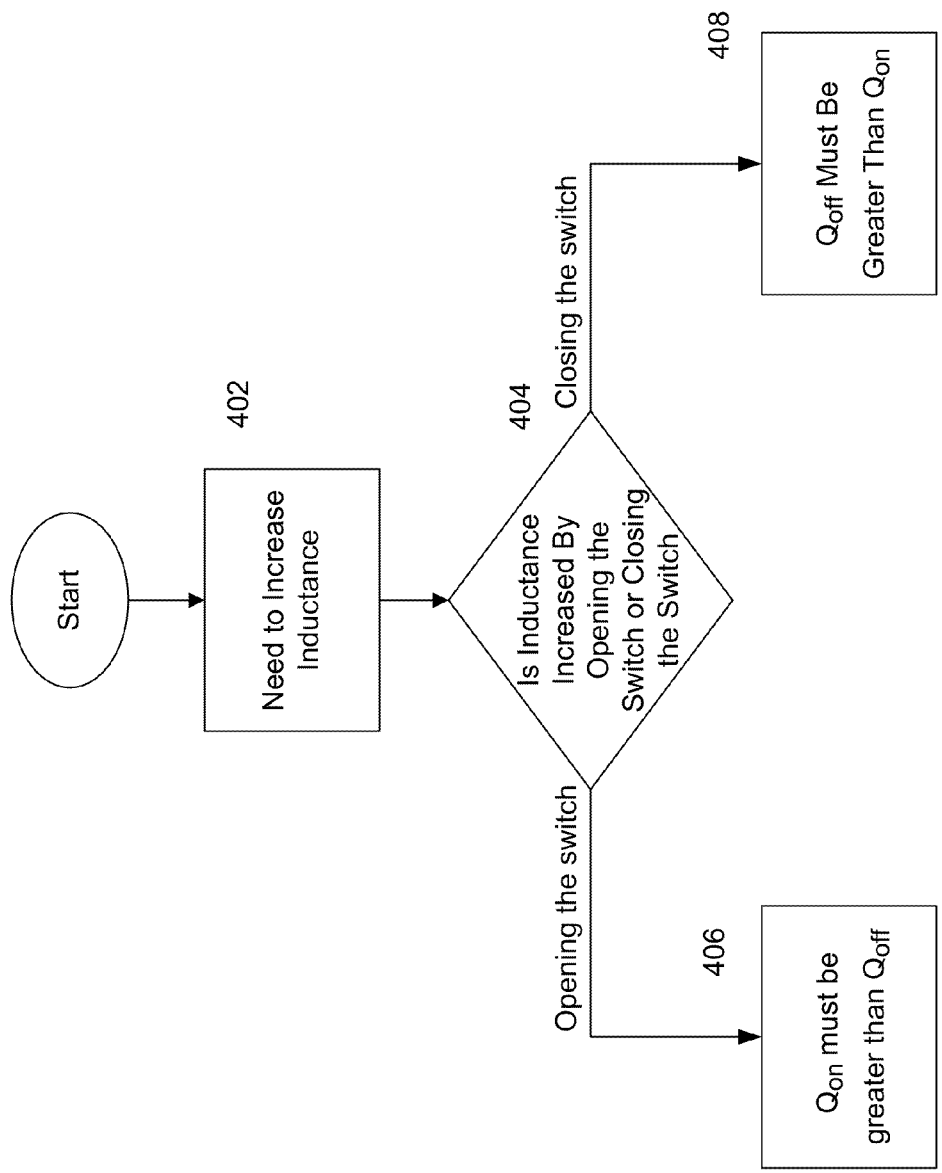
FIG. 4 depicts a flow chart illustrating design considerations for a tunable inductor.

Thus, for a tunable inductor incorporating one or more switches, a solution that ensures a $Q_{on}$ that increases as the level of inductance decreases is needed. If $L_{off}$ is greater than $L_{on}$, then a $Q_{on}$ that is greater than $Q_{off}$ is required. If $L_{on}$ is greater than $L_{off}$, then a $Q_{off}$ that is greater than $Q_{on}$ is required. This requirement is illustrated in FIG. 4. At step 402, there is a need to increase the level of inductance of the inductor coil. At step 404, a determination is made of whether this is accomplished by opening a switch or closing a switch. If the inductance is increased by opening the switch (i.e., $L_{off}$ is greater than $L_{on}$), then at step 406, a $Q_{on}$ that is greater than $Q_{off}$ is required. If the inductance is increased by closing the switch (i.e., $L_{off}$ is greater than $L_{on}$), then at step 408, a $Q_{off}$ that is greater than $Q_{on}$ is required.

The present invention provides a tunable inductor coil that meets this requirement through unique arrangements of a plurality of distinct inductors, each comprising a plurality of turns. One embodiment incorporates three inductors, two port terminals, and a switch. A first inductor comprising two termini is coupled to a first and second port terminal. Each of a second and third inductor comprising two termini is coupled to a port terminal and the switch, wherein the connectivity of the inductors is toggled with the switch. Another embodiment incorporates three inductors, two port terminals, and a switch. A first inductor comprising two termini is coupled to a second and third inductor. Each of a second and third inductor comprise three termini and is coupled to a port terminal and a field effect transistor switch, wherein each of the second and third inductors share a turn with the first inductor. The connectivity of the inductors is toggled with the switch.

Figure 5:
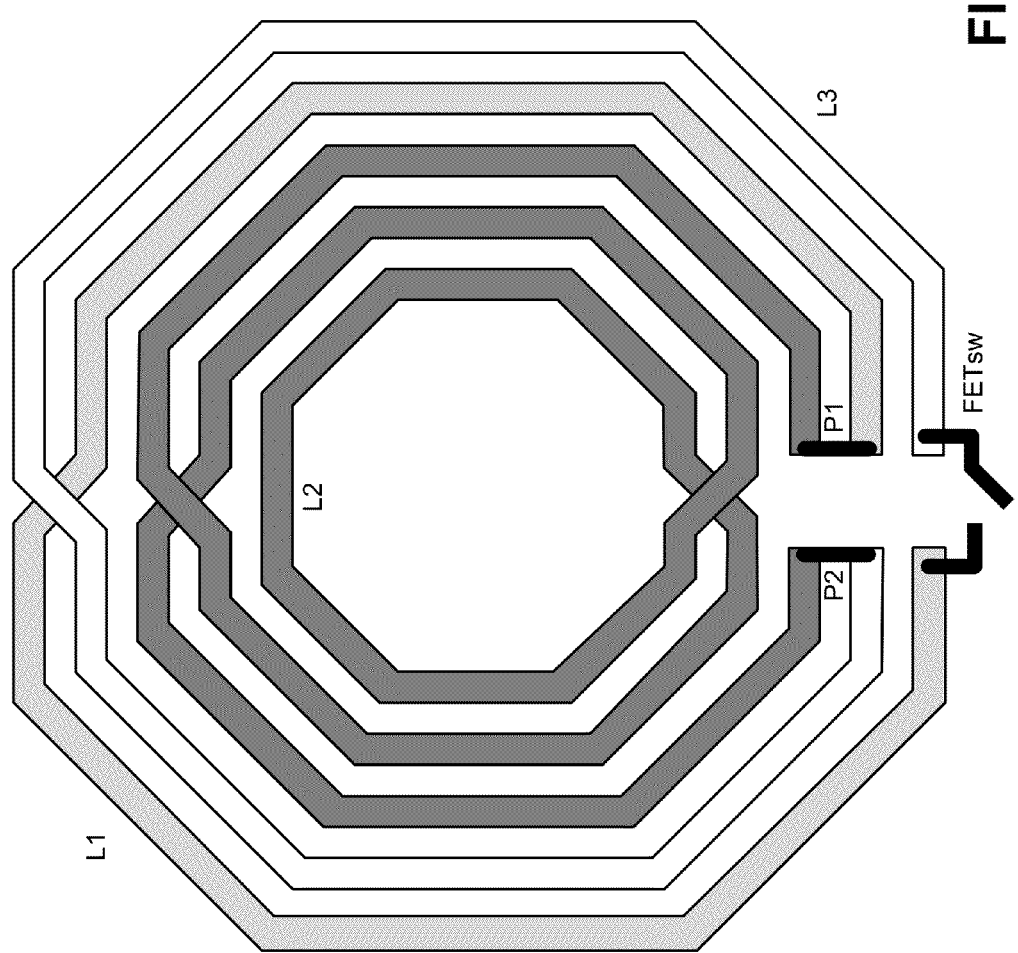
FIG. 5 depicts a geometric diagram of a tunable inductor configured according to an embodiment of the invention.
Figure 6:
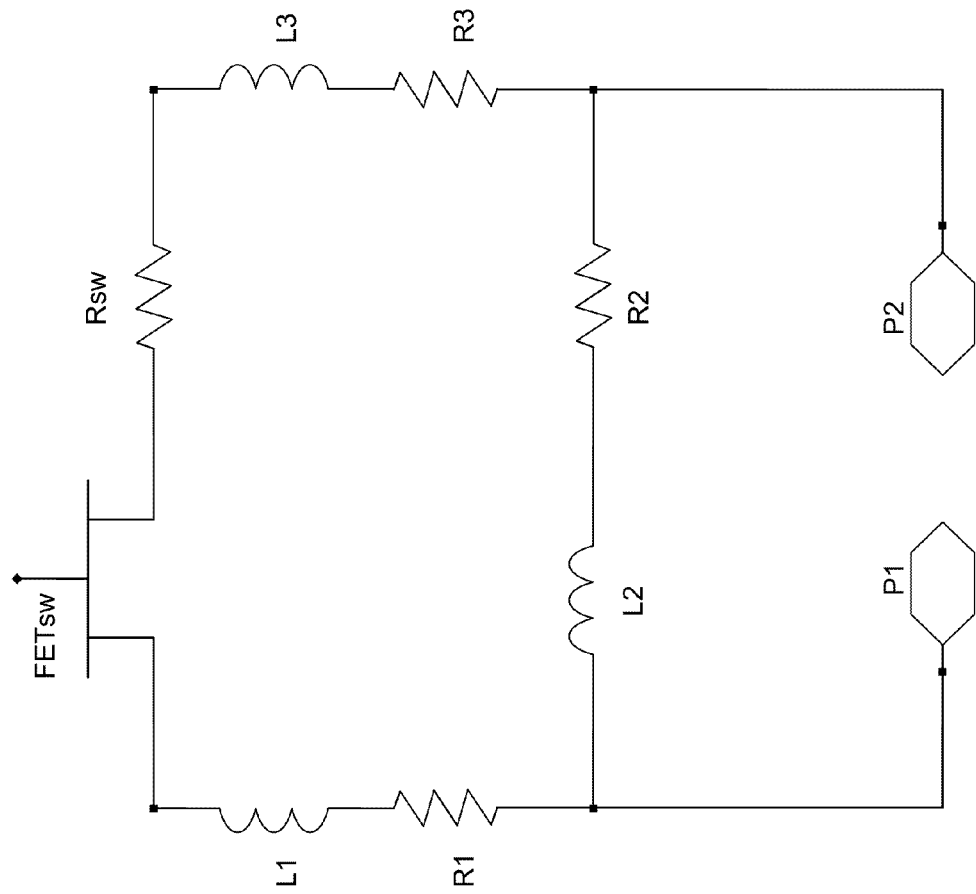
FIG. 6 depicts a circuit diagram of a tunable inductor configured according to an embodiment of the invention.

One embodiment is illustrated in FIGS. 5 and 6. FIGS. 5 and 6 depict a geometric diagram and a circuit diagram, respectively, of a tunable inductor coil including inductors L1, L2, and L3, terminals P1 and P2, and a switch $FET_{sw}$. In the illustrated embodiment, the switch comprises a field effect transistor switch. However, other switches may be used without deviating from the spirit or scope of the invention. As illustrated in the geometric diagram of FIG. 5, L1 and L3 comprise the outer two turns of the inductor coil and cross each other such that each comprises two halves of a complete turn. L2 comprises the inner turns of the inductor coil and is coupled to L1 and L3 through P2 and P1, respectively. The inductors are arranged in a concentric configuration to maximize inductance while minimizing coil length and distance between components. In the circuit diagram of FIG. 6, the L1, L2, and L3 windings are represented by the inductor symbols labeled L1, L2, and L3, respectively. The resistances R1, R2, and R3, coupled in series with inductors L1, L2, and L3, respectively, represent the resistive components of the L1, L2, and L3 windings of FIG. 5.

L1 and L3 are joined by $FET_{sw}$ and connected in parallel to L2, which is permanently connected to terminals P1 and P2. Thus, instead of multiple inductors connected in parallel, L1 and L3 are connected in series with each other and in parallel with L2. Switching $FET_{sw}$ tunes the inductance of the circuit by toggling the connectivity of the L1 and L3 series. In this embodiment, when the switch is closed, current injected at terminals P1 and P2 flows through the inner turn comprising L2 and the outer turns comprising L1 and L3 in parallel. When $FET_{sw}$ is open (i.e., off), L1 and L3 are removed from the circuit's total inductance, which consists entirely of L2 (mutual inductances ignored). Thus,
$L_{off}=L_2$, $R_{off}=R_2$, and $$Q_{off} = \frac{\omega \times L_2}{R_2}$$

When $FET_{sw}$ is closed, L1 and L3, which are connected to each other in series, are connected to L2 in parallel. Thus, $$L_{on} = L_2 \parallel (L_1 + L_3) = \frac{1}{\frac{1}{L_2} + \frac{1}{L_1 + L_3}},$$

$$R_{on} = R_2 \parallel (R_1 + R_{sw} + R_3) = \frac{1}{\frac{1}{R_2} + \frac{1}{R_1 + R_{sw} + R_3}}, \text{ and}$$

$$Q_{on} = \frac{\omega \times \left( \frac{1}{\frac{1}{L_2} + \frac{1}{L_1 + L_3}} \right)}{\left( \frac{1}{\frac{1}{R_2} + \frac{1}{R_1 + R_{sw} + R_3}} \right)} = \frac{\omega \times \left( \frac{1}{R_2} + \frac{1}{R_1 + R_{sw} + R_3} \right)}{\left( \frac{1}{L_2} + \frac{1}{L_1 + L_3} \right)}$$

The total inductance of a set of inductors connected in parallel is always less than that of the inductor with the lowest inductance in the set. Thus, $L_{off}$ is greater than $L_{on}$ in the above embodiment. Similarly, the total resistance of a set of resistors connected in parallel is always less than that of the resistor with the lowest resistance in the set, and $R_{off}$ is thus greater than $R_{on}$. Assuming the same values as used in above with respect to the prior art inductor coil depicted in FIGS. 1 and 2 (i.e., $L_1$=1 nH, $L_2$=2 nH, $L_3$=1 nH, $R_1$=1Ω, $R_2$=2Ω, $R_3$=1Ω, and $R_{sw}$=3Ω), when accounting for mutual inductance, $Q_{on}$ is greater than $Q_{off}$.

Figure 7:
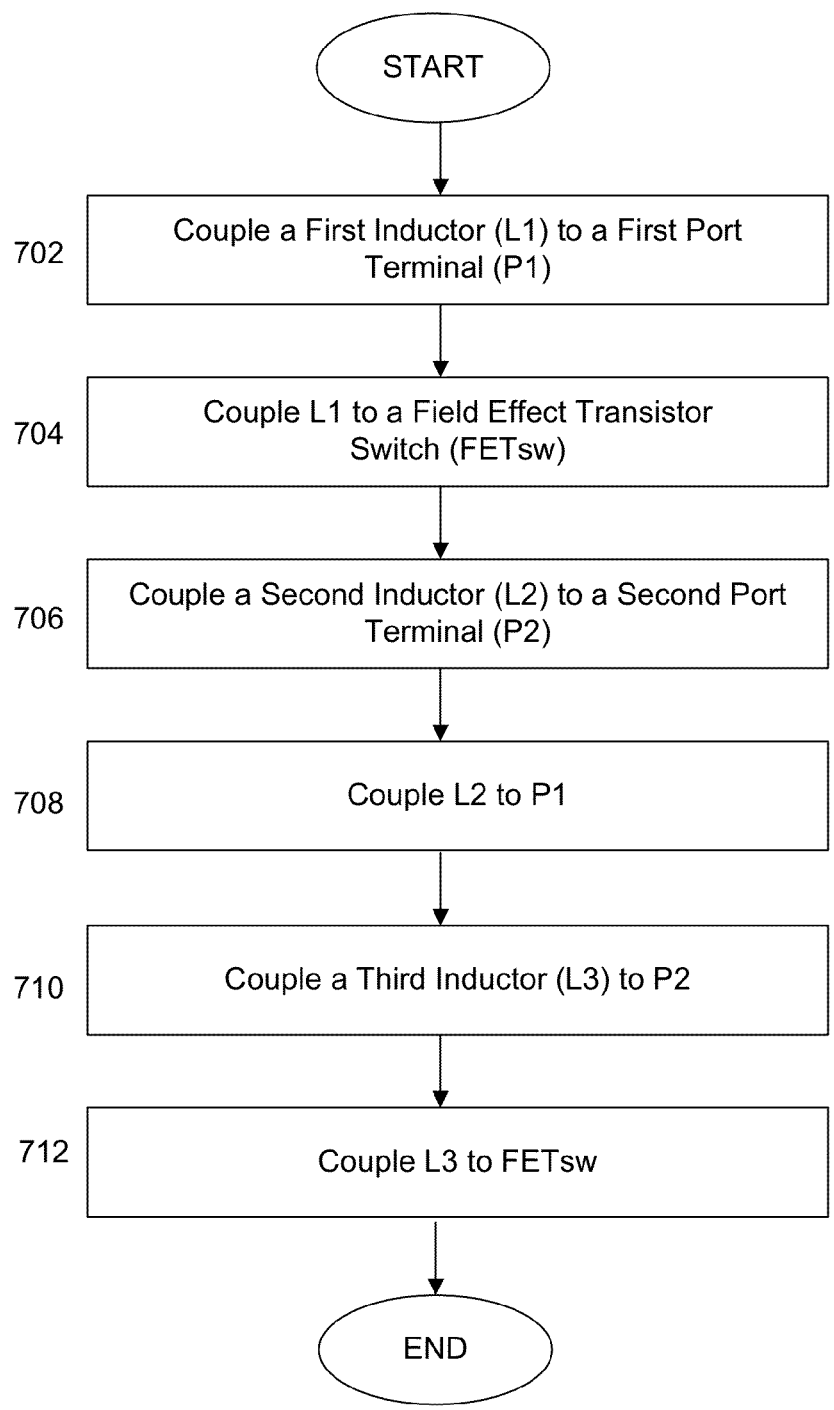
FIG. 7 depicts a flow diagram of a method for configuring a tunable inductor according to an embodiment of the invention.

FIG. 7 depicts a flowchart illustrating a method 700 for configuring a tunable inductor according to this embodiment. At step 702, the method begins with coupling a first inductor L1 to a first port terminal P1. At step 704, L1 is coupled to a field effect transistor switch $FET_{sw}$. At step 706, a second inductor L2 is coupled to a second port terminal P2. At step 708, L2 is coupled to P1. At step 710 a third inductor L3 is coupled to P2. The method concludes at step 712 with coupling L3 to $FET_{sw}$.

Figure 8A:
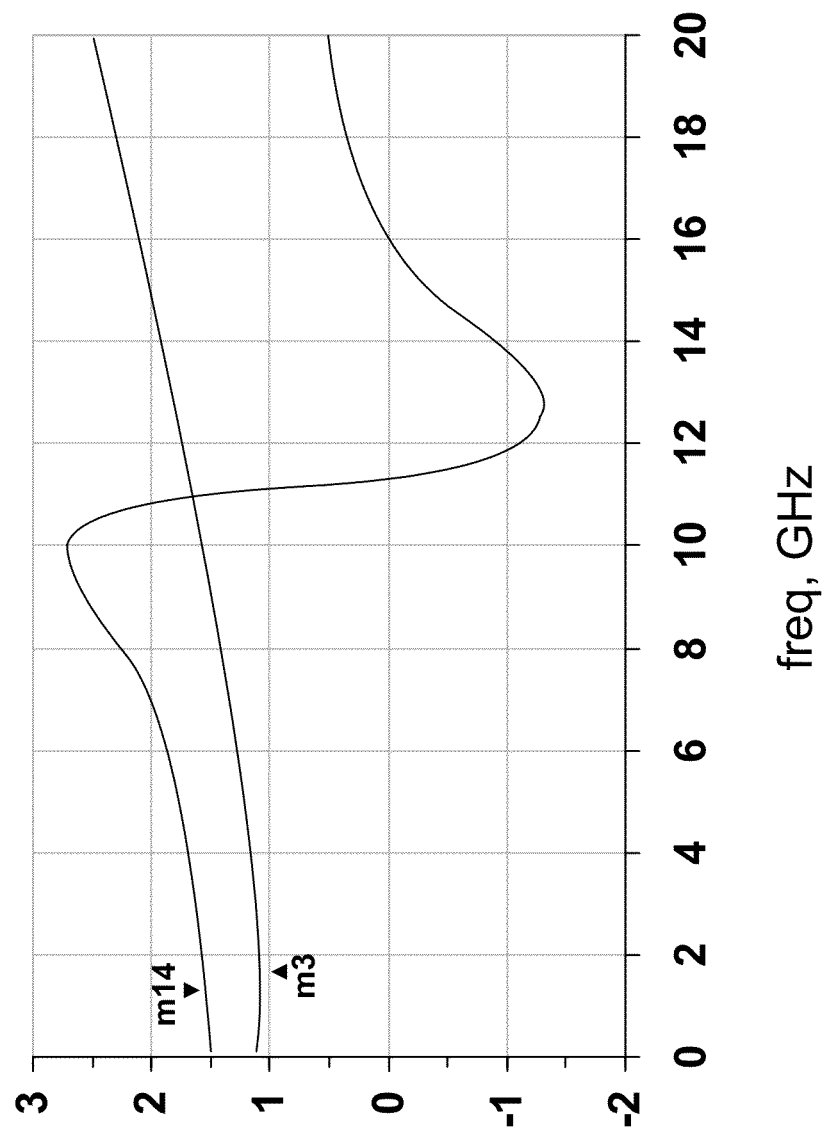
FIG. 8A depicts a graph of inductance plotted against frequency for a tunable inductor configured according to an embodiment of the invention.
Figure 8B:
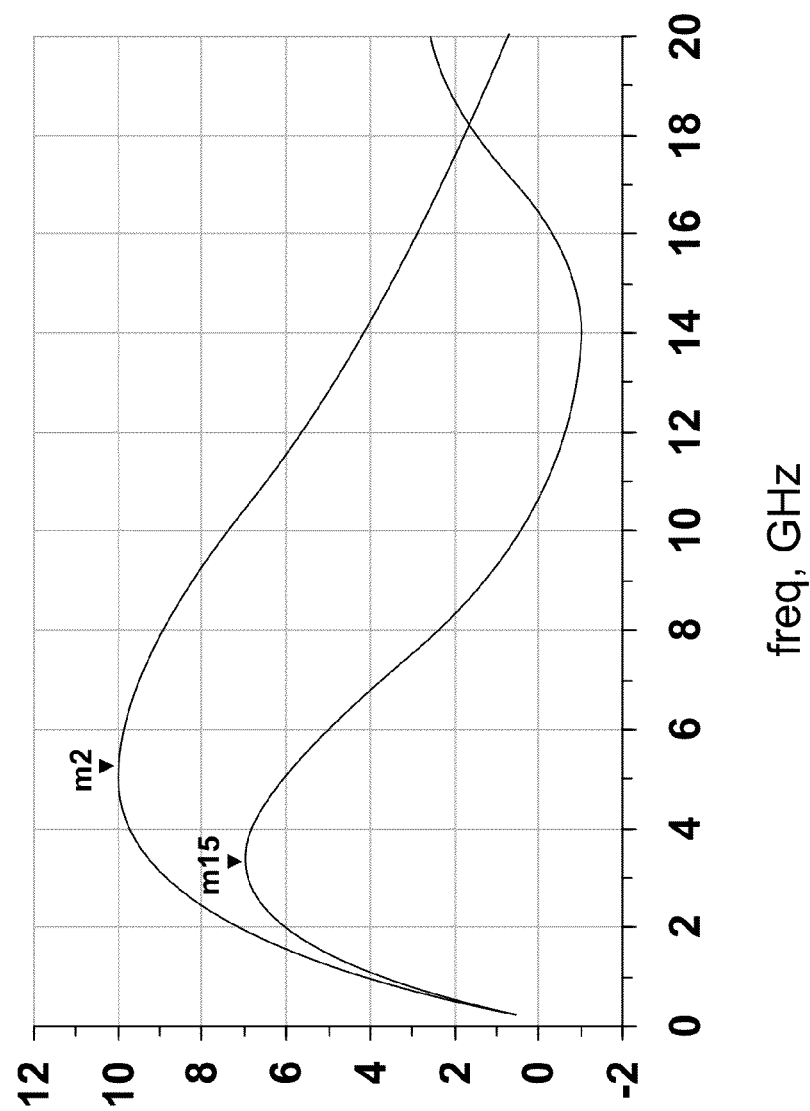
FIG. 8B depicts a graph of Q factor plotted against frequency for a tunable inductor configured according to an embodiment of the invention.

FIGS. 8A and 8B illustrate graphs plotting inductance and Q factor, respectively, against output frequency for an inductor coil configured according to the above-described embodiment. FIG. 8A shows a total inductance of 1.53 nH (indicated by m14) when $FET_{sw}$ is open ($L_{off}$), and a total inductance of 1.13 nH (indicated by m3) when $FET_{sw}$ is closed. FIG. 8B shows a Q factor of 7 at a frequency of 3.7 GHz (indicated by m15) when $FET_{sw}$ is open ($Q_{off}$) and a Q factor of 10 at a frequency of 4.9 GHz (indicated by m2) when $FET_{sw}$ is closed ($Q_{on}$).

The embodiment illustrated in FIGS. 5 and 6 may be improved, however. This embodiment overcomes the deficiencies of the inductor coil illustrated in FIGS. 1 and 2 by adding turns, which adds coil length. Added coil length increases the proximity between the various components in a circuit and thus raises their parasitic capacitance. Furthermore, because inductors L1 and L3 are directly connected to P2 and P1, they carry a capacitive load even when $FET_{sw}$ is off. Coupled with the added capacitance of $FET_{sw}$ itself, the capacitance of L1 and L3 contributes to the overall capacitance of the inductor coil, and thereby reduces the resonant frequency, potentially limiting the tuning range. For example, as illustrated in FIG. 8B, this embodiment achieves a maximum Q at a frequency of 4.9 GHz, which may be substantially lower than required for many applications.

This problem is addressed by reducing the length of the metal routing. Modifying the circuit illustrated in FIGS. 5 and 6 by combining the inner turns of L1 and L3 with the outer turn of L2 achieves a more compact circuit with a shorter routing length while preserving the tuning capability afforded by the multiple inductors and the switch.

One embodiment of a tunable inductor that minimizes parasitic capacitance by shortening routing length is depicted in FIG. 9. FIG. 9 depicts a geometric diagram of a tunable inductor coil including inductors L1, L2, and L3, port terminals P1 and P2, and a switch FETsw. In the illustrated embodiment, the switch comprises a field effect transistor switch. However, other switches may be used without deviating from the spirit or scope of the invention. As illustrated in FIG. 9, L1 and L3 comprise the outer two turns of the inductor coil and cross each other such that each comprises two halves of a complete turn. L2 comprises the inner turns of the inductor coil and is coupled to L1 and L3. L1 and L3 are split such that each comprises three termini. The split is placed near the point at which they cross, wherein the termini of the outer portions are coupled to $FET_{sw}$ and the termini of the inner portions are coupled to L2. The circuit diagram of the embodiment illustrated in FIG. 9 is identical to that of FIG. 6.

This embodiment minimizes routing length and unused turns by arranging the inductors such that portions of the coil serve dual purposes. In this embodiment, only L1 and L3 are permanently coupled to P2 and P1, respectively. L1 and L3 are split such that one portion is coupled to L2 and another is coupled to $FET_{sw}$. Thus, when $FET_{sw}$ is off, the inner turn of L3—which, in the embodiment illustrated in FIG. 5, would be unused—connects P1 to L2. Similarly, when $FET_{sw}$ is off, the inner turn of L1—which, in the embodiment illustrated in FIG. 5, would also be unused—connects P2 to L2. This arrangement retains the advantages of the embodiment illustrated in FIG. 5 but minimizes parasitic capacitance by minimizing unused portions of the coil. Specifically, this embodiment eliminates the parasitic capacitance of the inner turns of L1 and L3, since these turns now serve the dual purposes of connecting the port terminals to both L2 and $FET_{sw}$.

Figure 10:
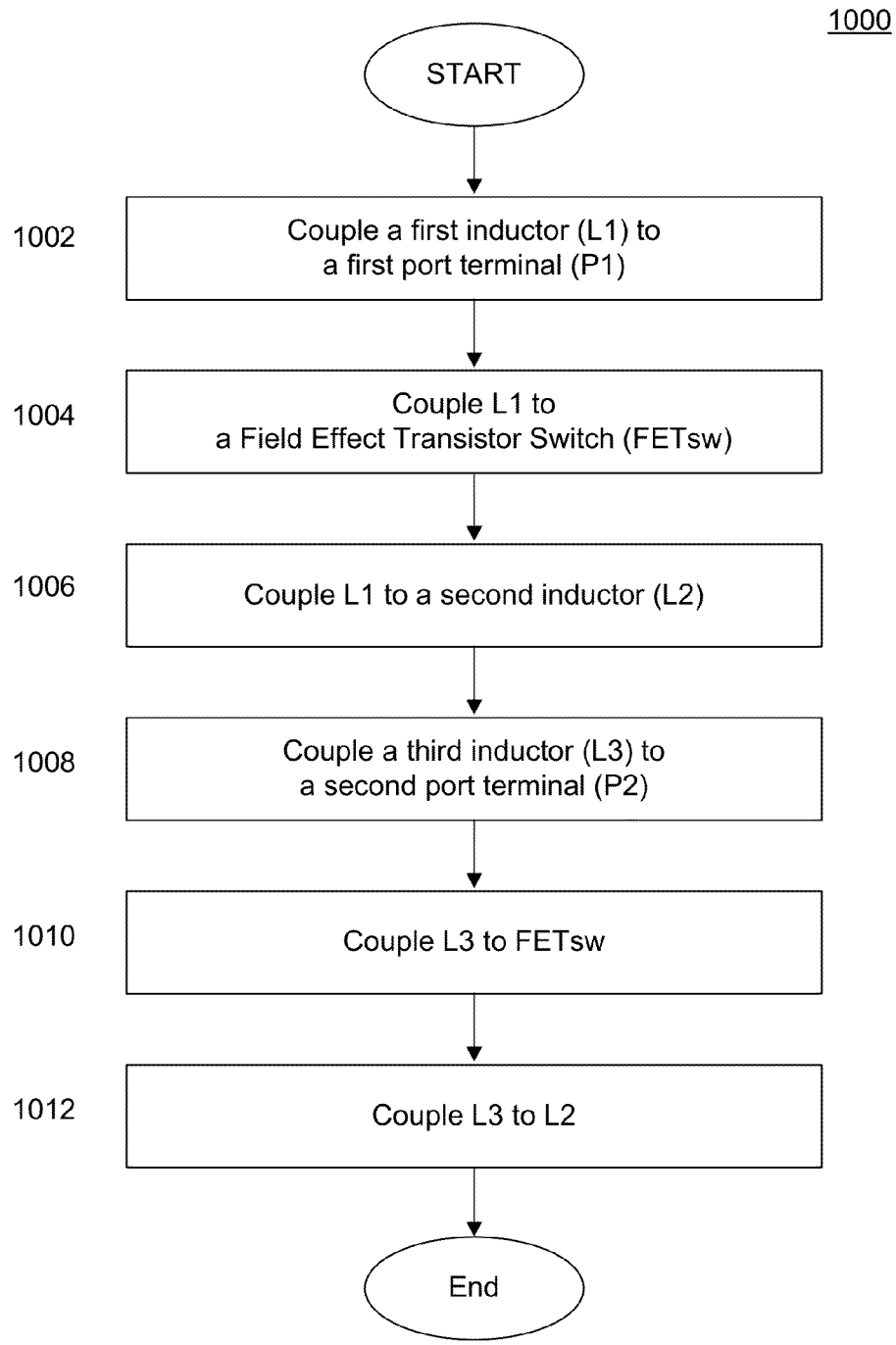
FIG. 10 depicts a flow diagram of a method for configuring a tunable inductor according to an embodiment of the invention.

FIG. 10 depicts a flowchart illustrating a method 1000 for configuring a tunable inductor according to this embodiment. At step 1002, the method begins with coupling a first inductor L1 to a first port terminal P1. At step 1004, L1 is coupled to a field effect transistor switch $FET_{sw}$. At step 1006, L1 is coupled to a second inductor L2. At step 1008, a third inductor L3 is coupled to a second port terminal P2. At step 1010, L3 is coupled to $FET_{sw}$. The method completes at step 1012 with the coupling of L3 to L2. In this embodiment, L1 and L3 are split such that that each may be simultaneously coupled to three distinct components.

Figure 11A:
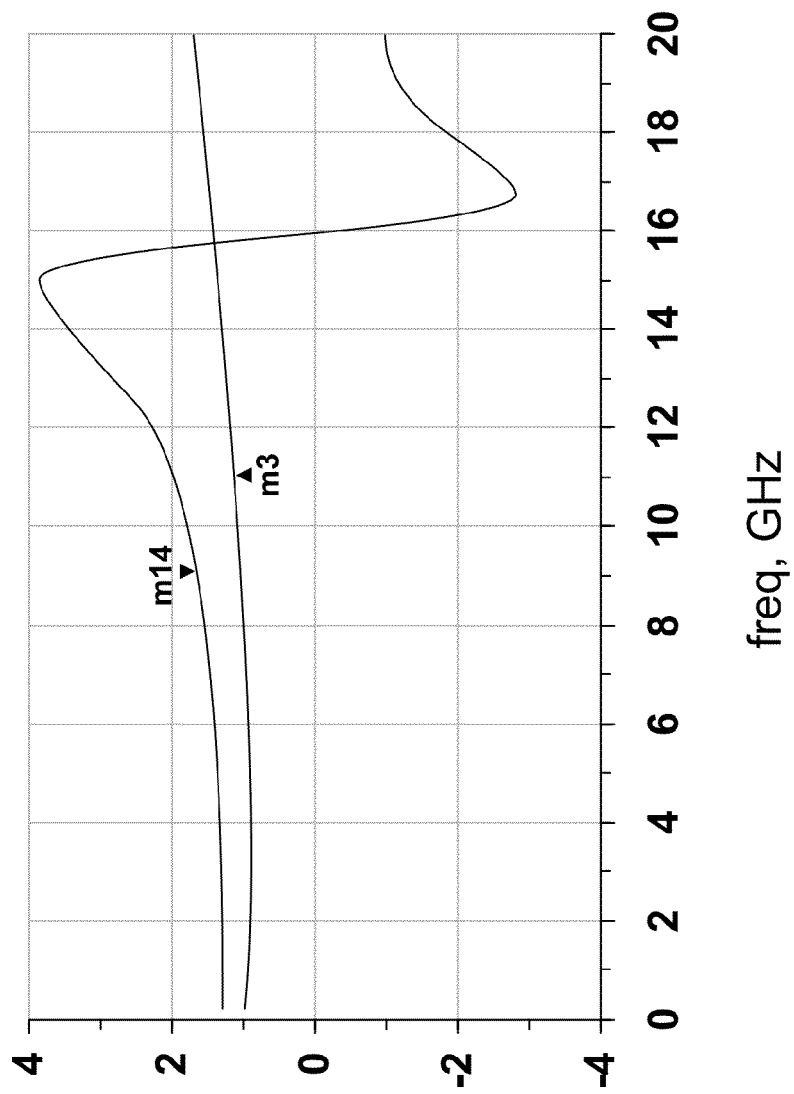
FIG. 11A depicts a graph of inductance plotted against frequency for a tunable inductor configured according to an embodiment of the invention.
Figure 11B:
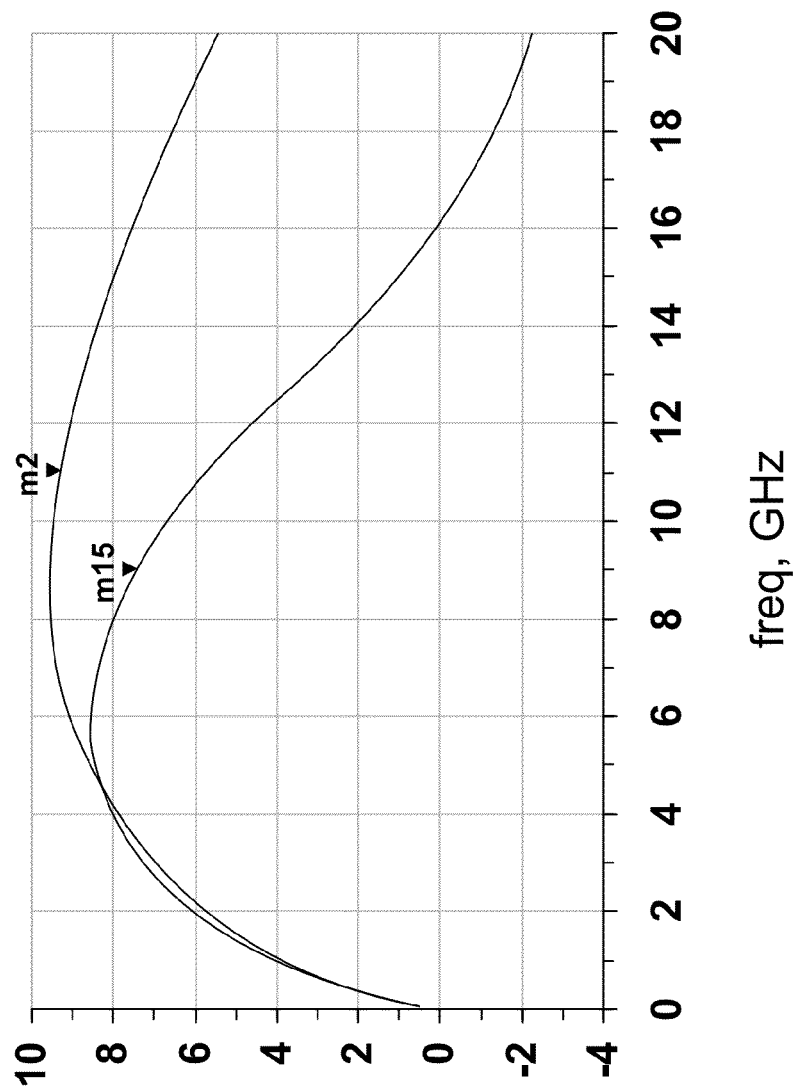
FIG. 11B depicts a graph of Q factor plotted against frequency for a tunable inductor configured according to an embodiment of the invention.

The advantages of this embodiment are apparent in the results depicted in FIGS. 11A and 11B. FIGS. 11A and 11B depict graphs plotting inductance and Q factor, respectively, against output frequency for an inductor coil configured according to the above-described embodiment. FIG. 11A shows a total inductance of 1.6 nH (indicated by m14) at 9 GHz when $FET_{sw}$ is open ($L_{off}$), and a total inductance of 1.04 nH (indicated by m3) at 11 GHz when $FET_{sw}$ is closed. FIG. 11B shows a Q factor of 7.24 at a frequency of 9 GHz (indicated by m15) when $FET_{sw}$ is open ($Q_{off}$) and a Q factor of 9.42 at a frequency of 11 GHz (indicated by m2) when $FET_{sw}$ is closed ($Q_{on}$). These values compare favorably with those of FIGS. 8A and 8B, in which the Q factor and resonant frequency do not exceed 10 and 4.9 GHz, respectively.

Figure 12A:
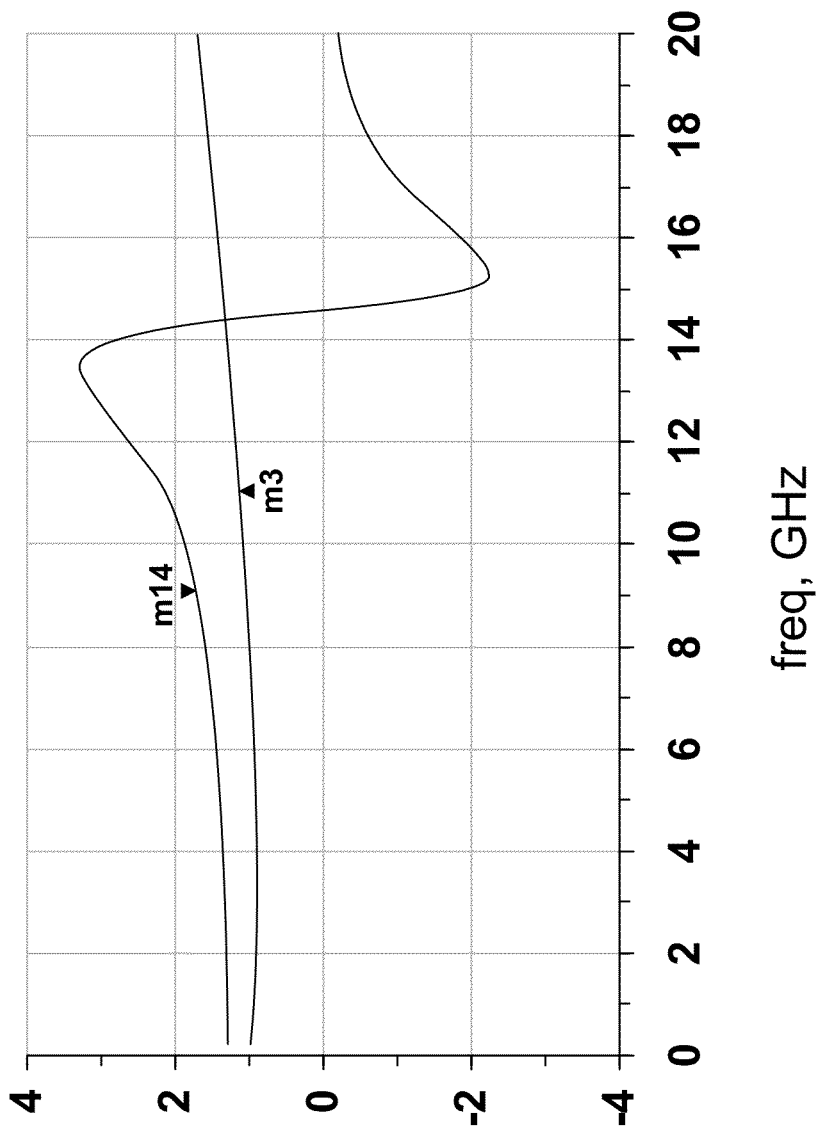
FIG. 12A depicts a graph of inductance plotted against frequency for a tunable inductor configured according to an embodiment of the invention.
Figure 12B:
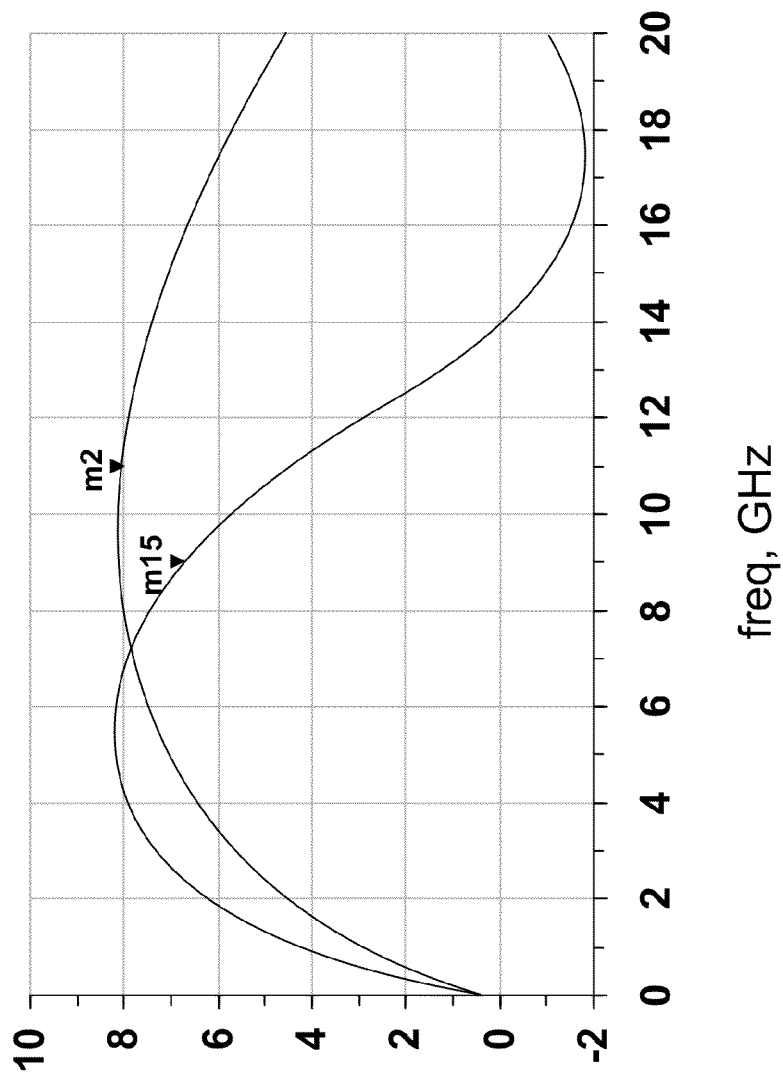
FIG. 12B depicts a graph of Q factor plotted against frequency for a tunable inductor configured according to an embodiment of the invention.

The tuning range, and hence the application, of each of the above-described embodiments depends on the capacitance and resistance of the various components used in configuring the tunable inductor coil. The most important among these is the switch. For example, the results depicted in FIGS. 8A, 8B, 11A, and 11B were achieved using example embodiments incorporating a field effect transistor switch with capacitance 130 fF in an open state, capacitance 260 fF in a closed state, and resistance 1Ω in a closed state. FIGS. 12A and 12B depict results for an embodiment whose topology is identical to that of FIG. 6, but which comprises a field effect transistor switch with capacitance 199 fF in an open state, capacitance 512 fF in a closed state, and resistance 2.74Ω in a closed state. FIG. 12A shows a total inductance of 1.66 nH (indicated by m14) at 9 GHz when $FET_{sw}$ is open ($L_{off}$), and a total inductance of 1.04 nH (indicated by m3) at 11 GHz when $FET_{sw}$ is closed. FIG. 12B shows a Q factor of 6.64 at a frequency of 9 GHz (indicated by m15) when $FET_{sw}$ is open ($Q_{off}$) and a Q factor of 7.95 at a frequency of 11 GHz (indicated by m2) when $FET_{sw}$ is closed ($Q_{on}$).

Generally, it is desirable to utilize a switch with a low capacitance value when open and a low resistance value when closed. However, low capacitance and low resistance are often mutually exclusive. For example, a large switch with a greater number of gates would decrease resistance, but the added bulk would increase parasitic capacitance. Similarly, a smaller switch with fewer gates would bear minimal parasitic capacitance, but yield greater resistance. Thus, determining which type of switch to use is a crucial consideration in configuring a tunable inductor according to each of the above embodiments and should be undertaken in accordance with the particular application desired.

Figure 13:
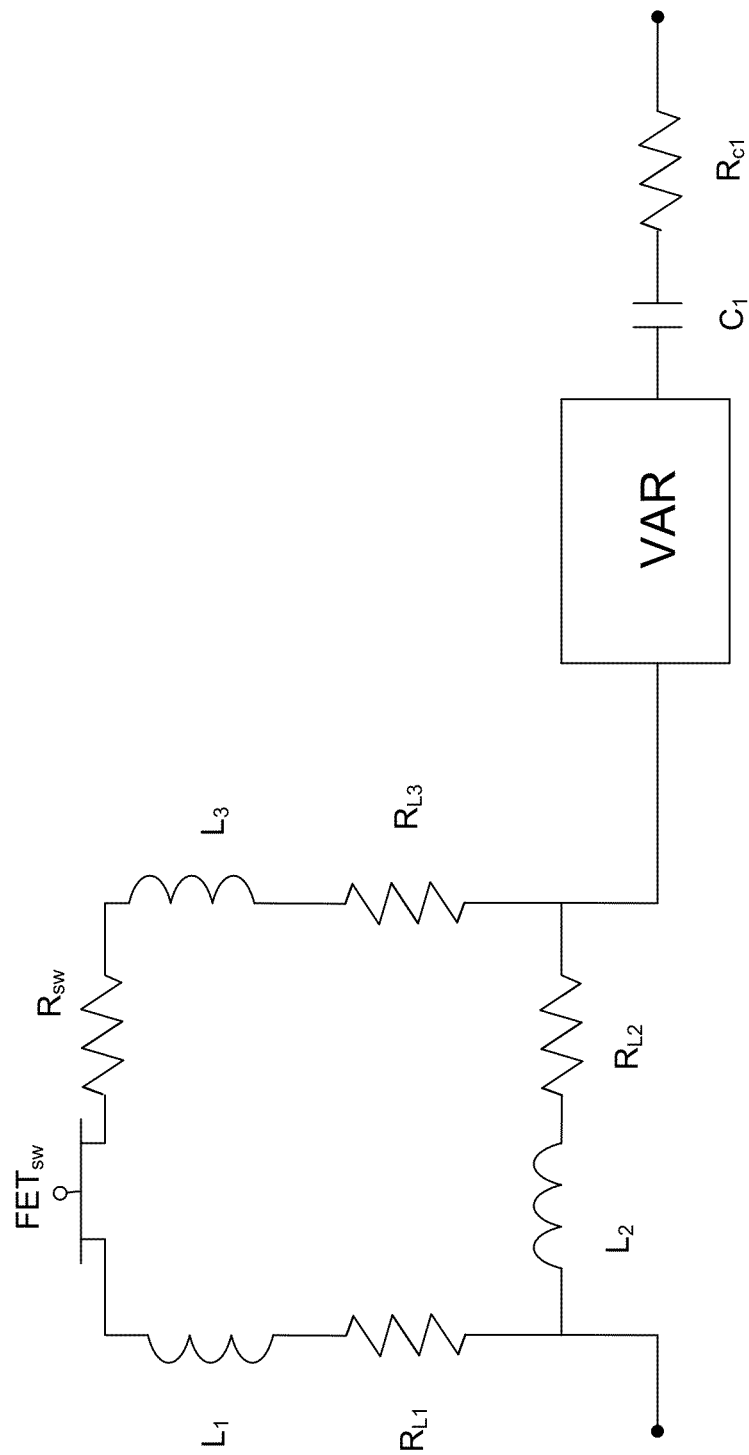
FIG. 13 depicts a circuit diagram of a voltage-controlled oscillator incorporating a tunable inductor configured according to an embodiment of the invention.

FIG. 13 illustrates an LC tank incorporating a tunable inductor according to the above-described embodiments configured in a voltage-controlled oscillator. The circuit diagram of FIG. 13 includes the tunable inductor of FIG. 6, incorporating inductors $L_1$, $L_2$, and $L_3$ with associated resistances $R_{L1}$, $R_{L2}$, and $R_{L3}$, respectively, and switch $FET_{sw}$ with associated resistance $R_{sw}$. The tunable inductor is coupled to at east one varactor VAR. The LC tank contains a capacitor $C_1$ with resistance $R_{C1}$. The VCO of FIG. 13 is more versatile than a VCO that achieves a similar tuning range exclusively through the use of varactors. As described above, varactors have a very low Q factor, and adding multiple varactors to a VCO significantly degrades the Q factor of the circuit. The resonant frequency of the VCO illustrated in FIG. 13 may be tuned by toggling FETsw in conjunction with adjusting the input voltages of the varactor(s) VAR, thereby achieving as wide a tuning range as a VCO with a greater number of varactors without substantially degrading the Q factor of the circuit.

Figure 14:
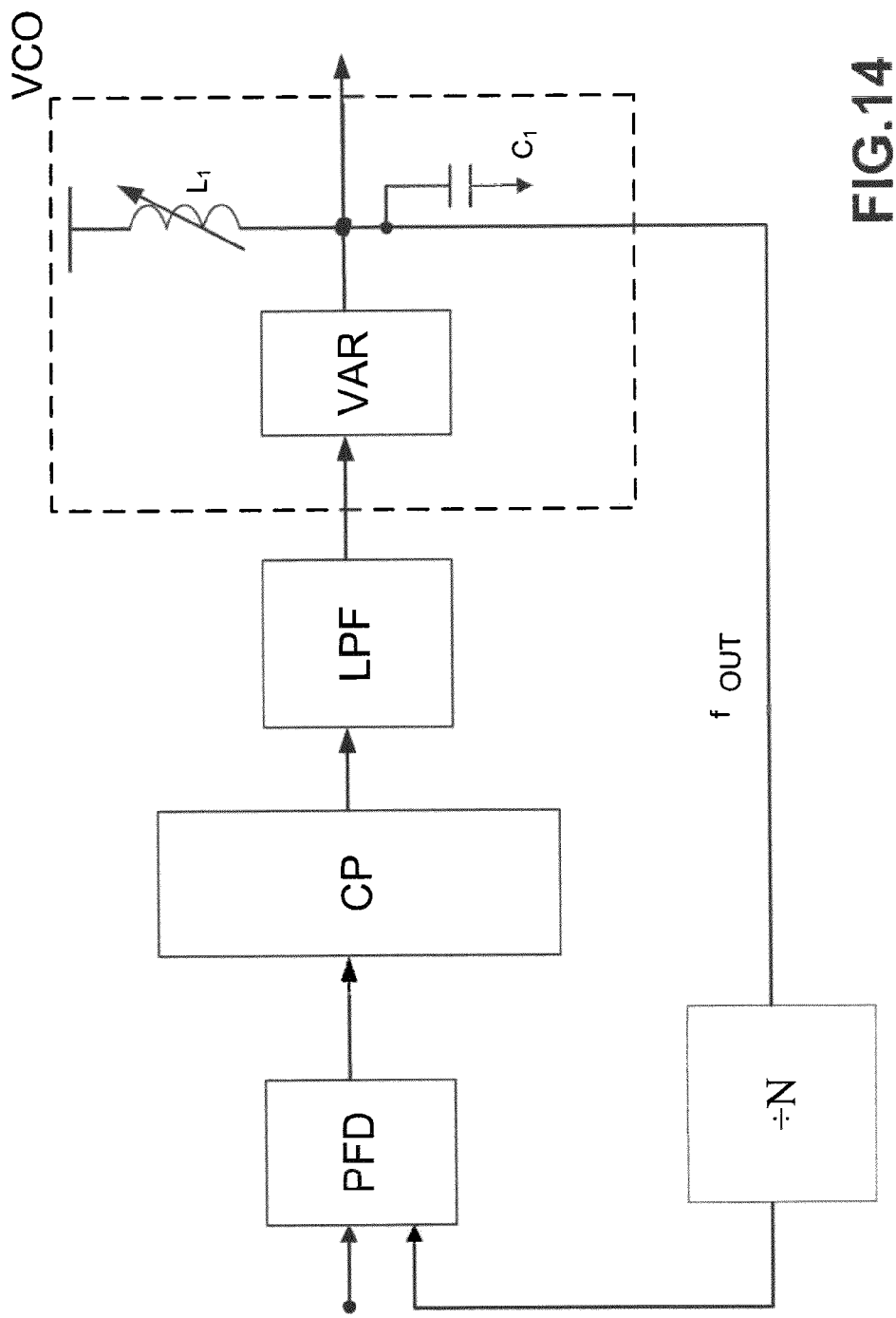
FIG. 14 depicts a circuit diagram of a phase-locked loop incorporating a voltage-controlled oscillator configured according to an embodiment of the invention.

FIG. 14 illustrates a VCO incorporating a tunable inductor according to the above-described embodiments configured in a phase-locked loop. The VCO includes at least one varactor VAR, a tunable inductor $L_T$, and a capacitor $C_1$ (resistances have not been shown). The phase locked loop circuit 1400 includes a phase frequency detector circuit PFD coupled to a charge pump CP. The charge pump CP supplies variable voltage (passed through a low-pass filter LPF) to the varactor (s) VAR. The VCO's output signal $f_{out}$ is passed through a divide by N counter÷N before being received by PFD. $L_T$ comprises multiple inductors and a switch (not shown) configured according to the embodiment illustrated in FIG. 5 or FIG. 9. Tuning the inductance of $L_T$ in conjunction with varying the input voltage to the varactors $VAR_1$ and $VAR_2$ can achieve a greater level of precision in adjusting the output signal $f_{out}$ without degrading the Q factor of the circuit.

In some implementations, an inductor configured according to any of the above-described embodiments may be bulkier than a prior art inductor without multiple inductor coils coupled to a switch. Thus, the benefits of the above-described embodiments can come at the expense of surface area. For example, according to one embodiment, a tunable inductor configured as described above measures 194 μm×194 μm. In contrast, a comparable prior art inductor measures 110 μm×110 μm.

Figure 15A:
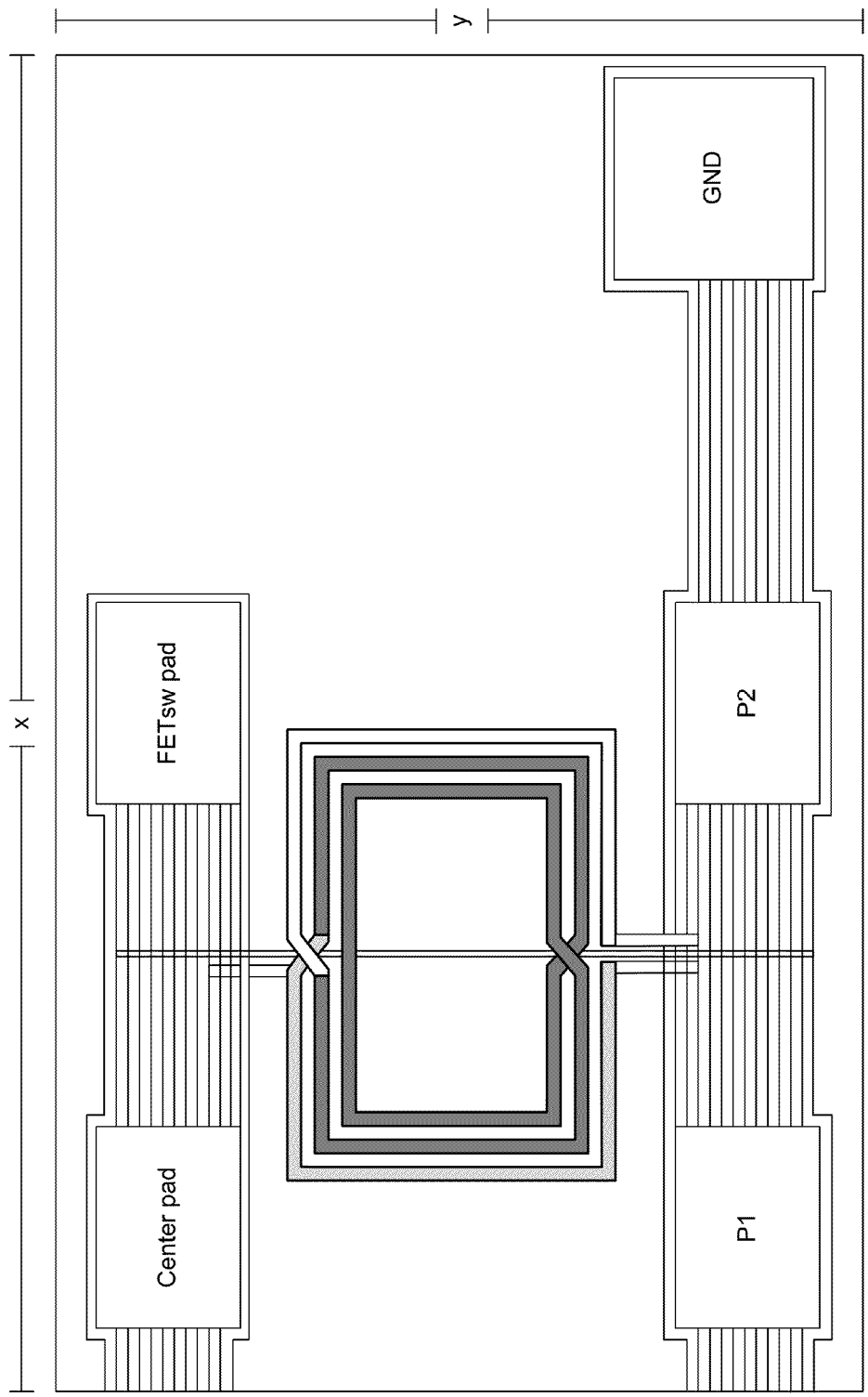
FIG. 15A depicts a diagram illustrating a tunable inductor configured within an integrated circuit according to an embodiment of the invention.
Figure 15B:
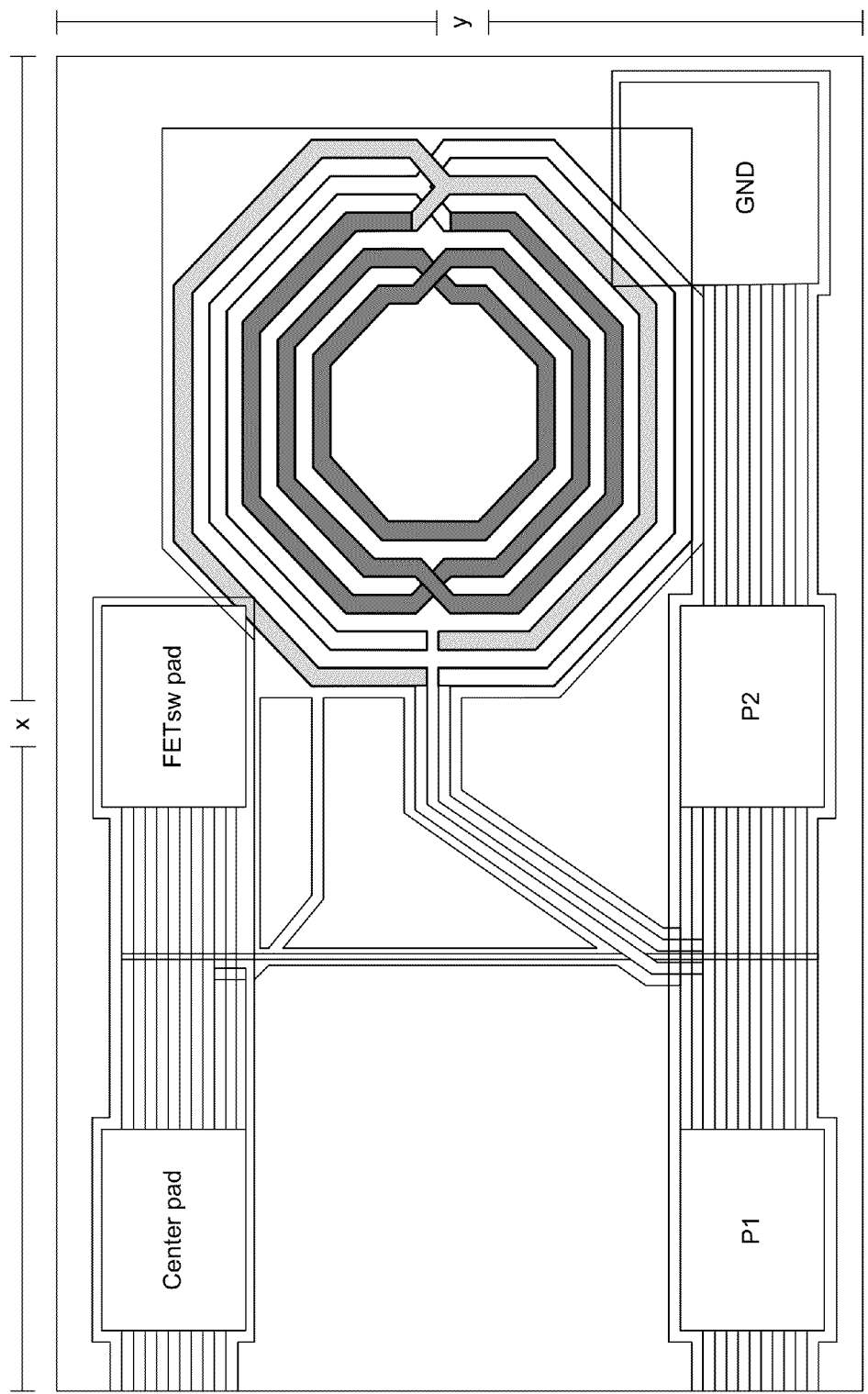
FIG. 15B depicts a diagram illustrating a tunable inductor configured within an integrated circuit according to an embodiment of the invention

This is illustrated in FIGS. 15A and 15B. FIGS. 15A and 15B each illustrate a portion of a circuit with limited surface area measuring a μm×b μm. FIG. 15A depicts a diagram partially illustrating the layout of a circuit incorporating a prior art inductor configured according to the embodiment of FIG. 2. The circuit includes port terminals P1 and P2, ground GND, a center pad, and a FETsw pad. The tunable inductor fits between the two rows of components, economizing surface area so as to reduce the size of the circuit or leave room for other components. FIG. 15B depicts a diagram partially illustrating the layout of a circuit incorporating a tunable inductor configured according to the embodiment of FIG. 9. In this layout, the tunable inductor does not fit between the rows of components as in FIG. 15A and must be placed to the side between the FETsw pad and GND. In addition, because the inductor cannot be directly coupled to the port terminals and the FETsw pad, connectors must be routed from the tunable inductor to the port terminals and the FETsw. This takes up additional surface area and makes it difficult to reduce the size of the circuit or accommodate additional components.

In one series of embodiments, these shortcomings are overcome through orientation of the inductors on different layers within the circuit. An integrated circuit typically comprises a number of discrete metal layers upon which circuit elements may be deposed. A circuit element deposed on a layer may be isolated from a circuit element deposed on an adjacent layer and connected where necessary using a vertical interconnect access (VIA). Thus, according to one such embodiment, the inductors comprising the inductor coil are deposed on separate layers within the circuit.

Figure 16:
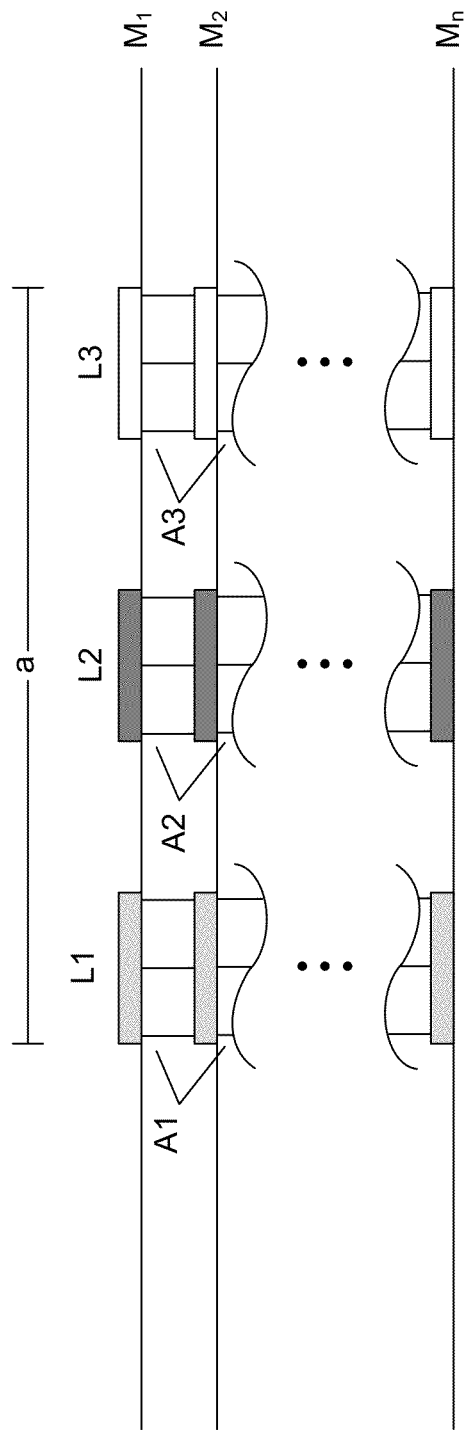
FIG. 16 depicts a diagram illustrating a tunable inductor configured across multiple layers according to an embodiment of the invention.
Figure 17A:
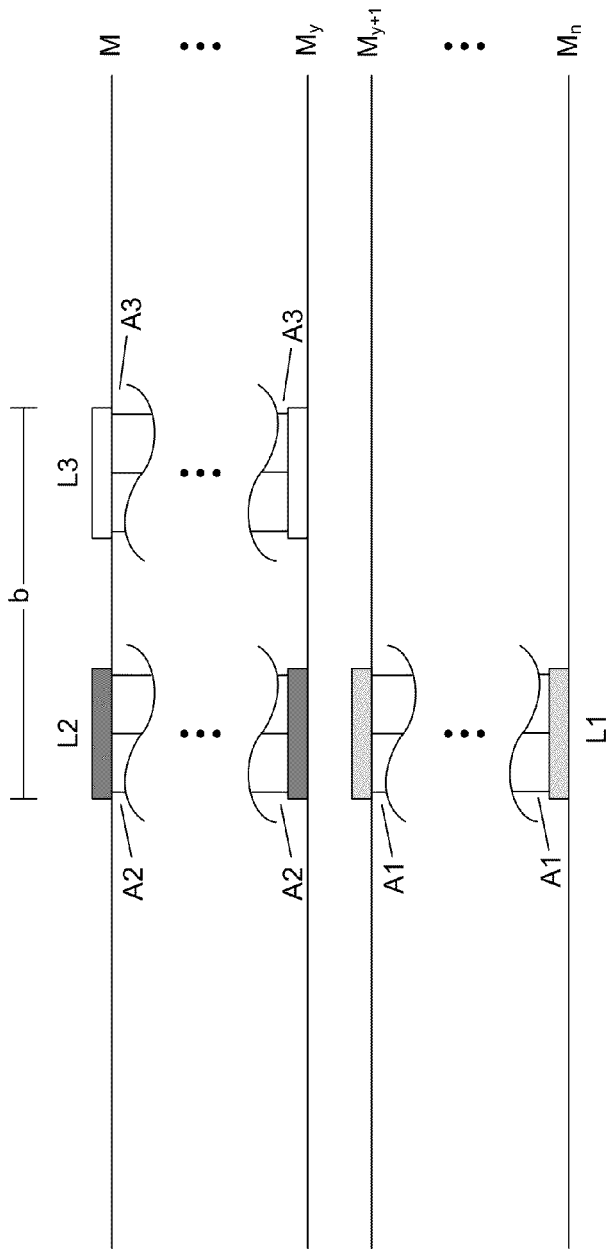
FIG. 17A depicts a diagram illustrating a tunable inductor configured across multiple layers according to an embodiment of the invention.
Figure 17B:
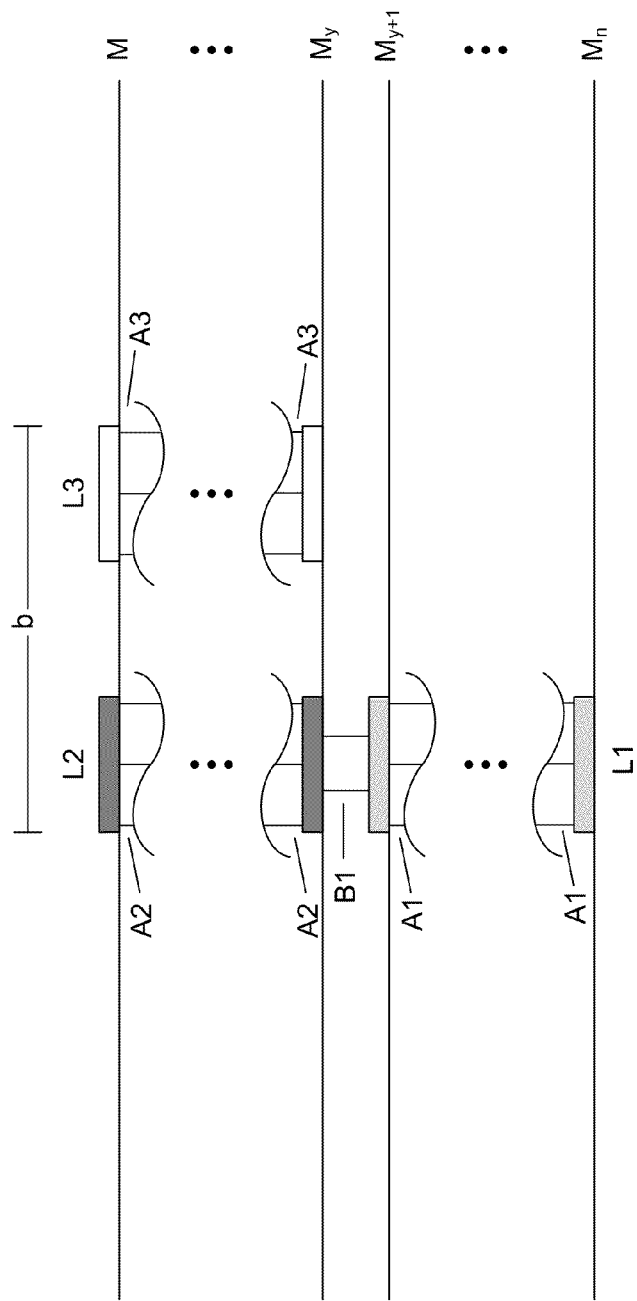
FIG. 17B depicts a diagram illustrating a tunable inductor configured across multiple layers according to an embodiment of the invention.

This series of embodiments is illustrated in FIGS. 16, 17A, and 17B. The diagram 1600 of FIG. 16 illustrates a partial cross-sectional view of an inductor configured according to the embodiment illustrated in either FIG. 5 or FIG. 9. Inductors L1, L2, and L3 each comprise n windings deposed along metal layers $M_1$ through $M_n$. The windings of each inductor are shorted with VIA components A1, A2, and A3. The inductors are coupled to each other or to a switch FETsw (not pictured) and port terminals P1 and P2 (not pictured) as illustrated in FIG. 5 or FIG. 9. Each of L1, L2, and L3 are embedded across the same layers, spanning surface area a within the circuit.

The diagram 1700 of FIG. 17A illustrates a partial cross-sectional view of an inductor configured according to the embodiment illustrated in FIG. 5. In this embodiment, the inductor is implemented across n discrete layers. Inductors L1, L2, and L3 each comprise y windings. The windings of L2 and L3 are disposed along layers $M_1$ through $M_y$. The windings of L1 are disposed across layers $M_{y+1}$ through $M_n$. The windings of each inductor are shorted with VIA components A1, A2, and A3. The inductors are coupled to a switch FETsw (not pictured) and port terminals P1 and P2 (not pictured) as illustrated in FIG. 5. In this embodiment, L1, L2, and L3 span surface area b within the circuit, wherein surface area b in FIG. 17B is smaller than surface area a in FIG. 16.

The diagram 1750 of FIG. 17B illustrates a partial cross-sectional view of an inductor configured according to the embodiment illustrated in FIG. 9. In this embodiment, the inductor is implemented across a surface of n discrete layers. Inductors L1, L2, and L3 each comprise y windings. The windings of L2 and L3 are disposed along layers $M_1$ through $M_y$. The windings of L1 are disposed across layers $M_{y+1}$ through $M_n$. The windings of each inductor are shorted with VIA components A1, A2, and A3. L2 is coupled to L3 directly (not pictured) and coupled to L2 with VIA components B1. L3 and L1 are coupled to a switch FETsw (not pictured) and port terminals P1 and P2 (not pictured) as illustrated in FIG. 9. In this embodiment, L1, L2, and L3 span surface area b within the circuit, wherein surface area b in FIG. 17B is smaller than surface area a in FIG. 16.

Any of the above-described embodiments may be implemented as a discrete component for mounting on a printed circuit board (PCB) or other surface.

Application Embodiments

Figure 18:
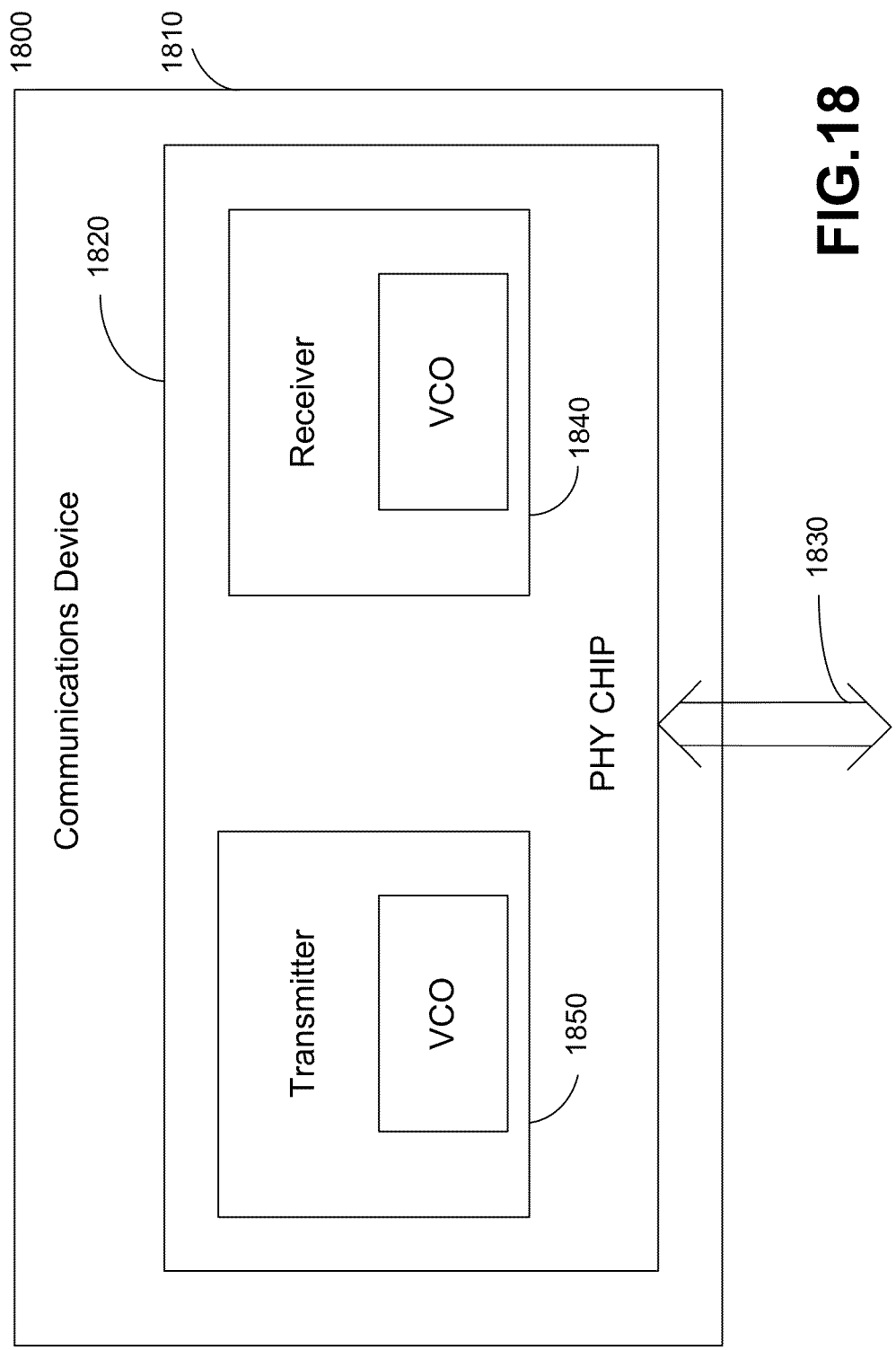
FIG. 18 depicts a diagram illustrating an integrated circuit implementation of the present invention according to an embodiment.

The systems, circuits, and methods disclosed herein may be implemented on one or more integrated circuits. FIG. 18 depicts a block diagram illustrating one embodiment for implementing the systems, circuits, and methods of the present invention on a single integrated circuit. In some embodiments, a physical layer ("PHY Layer") integrated circuit 1820 is used to define electrical and physical specifications for a communications device 1810. As such, the PHY Layer integrated circuit 1820 may define the relationship between the communications device 1810 and a transmission medium 1830. The PHY Layer integrated circuit 1820 may consist of the basic hardware transmission technologies of a network and provide related functions and services. For example, the PHY Layer integrated circuit may, but is not limited to, establish and terminate a connection to a transmission medium 1830, modulate or convert between the representation of digital data used in the communications device 1810 and the corresponding signals transmitted over the transmission medium 1830, providing a standardized interface to the transmission medium 1830, line coding, bit synchronization, circuit switching, multiplexing, forward error correction, and/or bit-interleaving.

In some embodiments, the PHY Layer integrated circuit 1820 may consist of a transmitter 1850 and a receiver 1840. In general, the transmitter 1850 may modulate and condition data streams for transmission over a transmission medium 1830 and the receiver 1840 may modulate and condition data streams transmitted to the receiver 1840 over a transmission medium 1830. In some embodiments, the transmitter 1850 and/or the receiver 1840 may comprise the systems, methods, and circuits discussed with relation to FIGS. 1, 2, 3, 5, 6, and 9. Specifically, the transmitter 1850 and receiver 1840 may each include a VCO incorporating a tunable inductor according to the embodiments described above. In some embodiments, the PHY Layer integrated circuit 1820 may operate as a transceiver (which may also include a VCO incorporating a tunable inductor according to the embodiments described above) such that the circuit both transmits data over the transmission medium 1830 and receives data from the transmission medium 1830. However, in some embodiments, each of the receiver 1840 and the transmitter 1850 may be implemented as a single integrated circuit. As such, the PHY Layer integrated circuit 1820 may be implemented in the form of a plurality of integrated circuits. Moreover, the transmitter 1850 and/or the receiver 1840 may each comprise IP blocks for incorporation into one or more integrated circuits. Although the PHY Layer integrated circuit 1820 has been discussed with relation to the transmitter 1850 and receiver 1840, it should be appreciated that the PHY Layer integrated circuit 1820 may comprise other hardware components, logical blocks, or integrated circuits that may implement the systems, methods, and circuits disclosed herein. As such, the PHY Layer integrated circuit 1820 may comprise any combination or number of receivers 1840, transmitters 1850, hardware components, logical blocks, and/or integrated circuits.

The transmission medium 1830 may transmit and receive data to and from the PHY Layer integrated circuit 1820 in order to facilitate data communication over a network. Examples of a transmission medium may comprise, but are not limited to, metallic cables, fiber optic cables, and a wireless network. In some embodiments, if a metallic cable is used as the transmission medium 1830, then the PHY Layer integrated circuit 1820 may convert data received from the transmission medium 1830 into electrical signals. In other embodiments, if a fiber optical cable is used as the transmission medium 1830, then the PHY Layer integrated circuit 1820 may convert data received from the transmission medium 1830 into luminous signals. Similarly, in some embodiments, if a wireless network is used as the transmission medium 1830, then the PHY Layer integrated circuit 1820 may convert data received from the transmission medium 1830 into electromagnetic signals. As such, in some embodiments, the PHY Layer integrated circuit 1820 receives data from the transmission medium 1830 and converts the data into signals representing binary 0's and 1's. This converted data may then be received by another component comprised within communications device 1810.

The PHY Layer integrated circuit 1820 may be configured to function with relation to a variety of protocols used by the communications device 1810. For example, the PHY Layer Integrated circuit 1820 may be configured to function with regard to an IEEE 802.3 standard such as a 10 Gigabit Ethernet (10 GigE) standard. The PHY Layer integrated circuit 1820 may be configured to function in conjunction with other protocols. Examples of such protocols may comprise, but are not limited to, Synchronous Optical Networking (SONET)/Synchronous Digital Hierarchy (SDH), V.92 for telephone network modems, Infrared Data Association (IrDA) Physical Layer, Universal Serial Bus (USB) Physical Layer, Recommended Standard 232 (RS-232), RS-422, RS-423, RS-449, RS-485, Ethernet Physical Layer (10Base-T, 10BASE2, 100BASE-TX, 10 GigE, etc.), 802.11 Wi-Fi Physical Layers, Digital Subscriber Line (DSL), Integrated Services Digital Network (ISDN), Optical Transport Network (OTN), Bluetooth Physical Layer, and Firewire.

In some embodiments, the PHY Layer integrated circuit 1820 may receive data or a request from another hardware component or software module within the communications device 1810. A software module or hardware component operating at a Data Link Layer may transmit data and/or requests to the PHY Layer integrated circuit 1820. For example, the PHY Layer integrated circuit 1820 may translate logical communication requests from the software module or component operating at a Data Link Layer into hardware specific operations that may affect the transmission or reception of electronic signals over the transmission medium 1830. As such, in some embodiments, the PHY Layer integrated circuit 1820 may communicate and interact with software modules or another component operating at another portion or layer of a communications system. For example, the PHY Layer integrated circuit 1820 may communicate with another software module or another hardware component operating within the Physical Layer, Data Link Layer, Network Layer, Transport Layer, Session Layer, Presentation Layer, and/or Application Layer. As such, the PHY Layer integrated circuit 1820 may be comprised within a communications device 1810 that may also comprise other software modules or hardware components that directly or indirectly communicate with the PHY Layer integrated circuit 1820.

As a result, in some embodiments, the PHY Layer integrated circuit 1820 may receive data from a transmission medium 1830. The PHY Layer integrated circuit 1820 may convert the data and the resulting converted data may be used by other software modules or hardware components within the communications device 1810 or in a separate communications device.

The communications device 1810 may comprise a hardware component configured to operate within a network environment. Examples of a communications device 1810 that may comprise the PHY Layer integrated circuit 1820 are, but are not limited to, a network adapter, network interface controller (NIC), repeater, network hub, switch, router, modem, USB controller, Serial ATA controller, SDRAM chip interface, flash memory chip interface, transceiver, or a host bus adapter (HBA). The communications device 1810 may comprise, but is not limited to, components of an optical fiber network, such as those components mentioned earlier or a fiber media converter, an add-drop multiplexer (ADM), reconfigurable optical add-drop multiplexers (ROADMs), a regenerator, or a digital cross connect system (DCS). As such, the communications device 1810 may comprise at least one hardware component configured to operate within a network environment.

Figure 19:
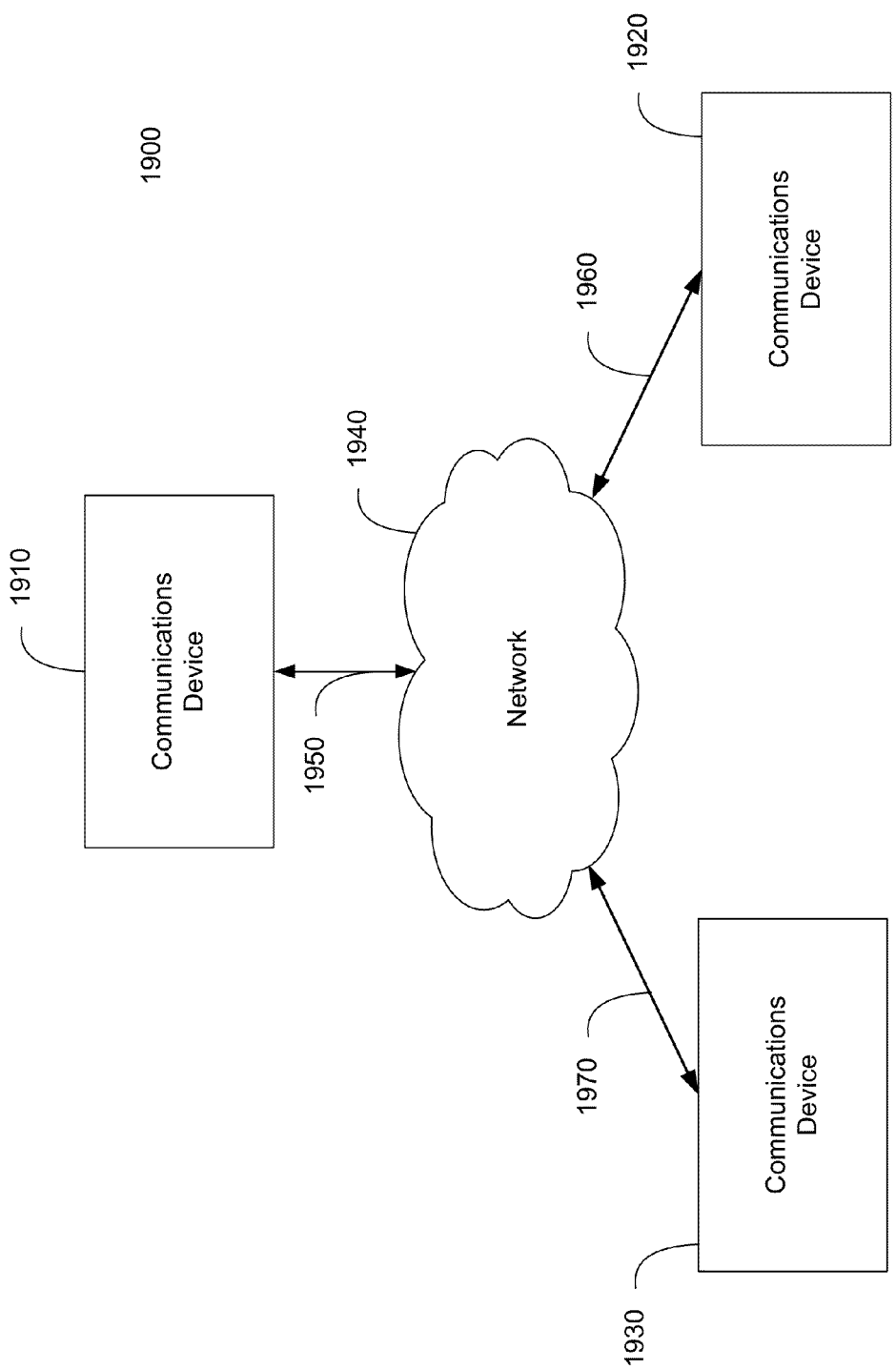
FIG. 19 depicts a diagram illustrating an example illustration of a network environment implementing the present invention according to an embodiment.

FIG. 19 is a block diagram illustrating an example embodiment of a network system 1900 that may incorporate the systems, circuits, and methods disclosed herein. In some embodiments, one or more communication devices 1910, 1920, and 1930 are coupled to a network 1940 by a transmission medium 1950, 1960, or 1970. In some embodiments, the communication device 1910 may comprise a router coupled to one or more computer devices (not shown) such that the computers are coupled to the network 1940 by means of the router. The router may incorporate one or more PHY Layer integrated circuits 1820. In turn, the PHY Layer integrated circuits may incorporate a receiver and/or a transmitter. In some embodiments, the PHY Layer integrated circuits comprise, at least in part, the various components discussed with relation to FIGS. 1, 2, 3, 5, 6, and 9.

In operation, the router 1920 may use a PHY Layer integrated circuit 1820 to transmit data to communications device 1930. As such, the PHY Layer integrated circuit 1820 may be enabled to transmit data from the communication device 1910 over the transmission medium 1950, through the network 1940, to transmission medium 1960 to communications device 1920. The communications device 1920 may also comprise a PHY Layer integrated circuit 1820 that is configured to receive data over the transmission medium 1960.

Hardware Embodiments

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal (presumably previously defined broadly). In the alternative, the processor and the storage medium may reside as discrete components in a user terminal The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit incorporating a tunable inductor comprising:
   a plurality of port terminals comprising at least a first port terminal and a second port terminal;
   a switch comprising at least a first input and a second input;
   a first inductance, comprising at least one winding, coupled to the first port terminal and the first input;
   a second inductance, comprising at least one winding, coupled to at least one of the first port terminal and the first inductance and at least one of the second port terminal and a third inductance;
   the third inductance, comprising at least one winding, coupled to the second port terminal and the second input;
   wherein each of the first inductance and the second inductance is substantially disposed on at least one layer within a first bounded horizontal area, and the first inductance is disposed beneath the second inductance; and
   wherein said switch, when closed, couples said first inductance and said third inductance in parallel with said second inductance.

2. The integrated circuit of claim 1, further comprising a plurality of additional layers.

3. The integrated circuit of claim 2, wherein the additional layers are disposed beneath the layers of the first inductance and the second inductance.

4. The integrated circuit of claim 2, wherein the additional layers comprise a bottom ground layer.

5. The integrated circuit of claim 2, wherein the additional layers comprise a bottom ground layer separated from the layers of the first inductance and the second inductance by at least one intermediate layer.

6. The integrated circuit of claim 1, wherein at least one of the first inductor, the second inductor, and the third inductor comprise a plurality of windings fabricated across a plurality of layers.

7. The integrated circuit of claim 6, wherein the windings fabricated across the layers are shorted by a plurality of vertical interconnect access (VIA) elements.

8. The integrated circuit of claim 1, wherein the switch is at least one of a field effect transistor switch and a low-voltage device.

9. The integrated circuit of claim 1, wherein the third inductance is substantially disposed within a second bounded horizontal area adjacent to the first bounded horizontal area.

10. The integrated circuit of claim 1, wherein closing said switch further decreases an inductance value and increases a Q factor of a circuit incorporating the tunable inductor.

11. A method for configuring an integrated circuit incorporating a tunable inductor, the method comprising:
   coupling a first inductance, comprising at least one winding, to a first port terminal and a first input to a switch;
   coupling a second inductance, comprising at least one winding, to at least one of the first port terminal and the first inductance and at least one of a second port terminal and a third inductance;
   coupling the third inductance, the third inductance comprising at least one winding, to the second port terminal and a second input to the switch;
   wherein each of the first inductance and the second inductance is substantially disposed on at least one layer within a first bounded horizontal area, and the first inductance is disposed beneath the second inductance; and
   wherein said switch, when closed, couples said first inductance and said third inductance in parallel with said second inductance.

12. The method of claim 11, further comprising a plurality of additional layers.

13. The method of claim 12, wherein the additional layers are disposed beneath the layers of the first inductance and the second inductance.

14. The method of claim 12, wherein the additional layers comprise a bottom ground layer.

15. The method of claim 12, wherein the additional layers comprise a bottom ground layer separated from the layers of the first inductance and the second inductance by at least one intermediate layer.

16. The method of claim 11, wherein at least one of the first inductor, the second inductor, and the third inductor comprise a plurality of windings fabricated across a plurality of layers.

17. The method of claim 16, wherein the windings fabricated across the layers are shorted by a plurality of vertical interconnect access (VIA) elements.

18. The method of claim 11, wherein the switch is at least one of a field effect transistor switch and a low-voltage device.

19. The method of claim 11, wherein the third inductance is substantially disposed within a second bounded horizontal area adjacent to the first bounded horizontal area.

20. A voltage controlled oscillator, comprising:
   at least one varactor;
   at least one capacitor;
   a tunable inductor comprising:
      a plurality of port terminals comprising at least a first port terminal and a second port terminal;
      a switch comprising at least a first input and a second input;
      a first inductance, comprising at least one winding, coupled to the first port terminal and the first input;
      a second inductance, comprising at least one winding, coupled to at least one of the first port terminal and the first inductance and at least one of the second port terminal and a third inductance;
      the third inductance, comprising at least one winding, coupled to the second port terminal and the second input;
      wherein each of the first inductance and the second inductance is substantially disposed on at least one layer within a first bounded horizontal area, and the first inductance is disposed beneath the second inductance; and
      wherein said switch, when closed, decreases an inductance value and increases a Q factor of said voltage controlled oscillator.

21. The voltage controlled oscillator of claim 20, wherein toggling said switch tunes the resonant frequency of said voltage controlled oscillator.

22. The voltage controlled oscillator of claim 20, wherein the voltage controlled oscillator is configured within a phase-locked loop circuit further comprising:
   a voltage source;
   a phase frequency detector; and
   wherein the voltage source supplies voltage to the varactor and the voltage-controlled oscillator generates an output signal that is received by the phase frequency detector.

* * * * *